(12) United States Patent
Morihara et al.

(10) Patent No.: US 6,459,113 B1
(45) Date of Patent: Oct. 1, 2002

(54) SEMICONDUCTOR INTEGRATED CIRCUIT DEVICE AND METHOD OF MANUFACTURING THE SAME, AND CELL SIZE CALCULATION METHOD FOR DRAM MEMORY CELLS

(75) Inventors: Toshinori Morihara; Hiroki Shimano; Kazutami Arimoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 5 days.

(21) Appl. No.: 09/760,804

(22) Filed: Jan. 17, 2001

(30) Foreign Application Priority Data

Aug. 10, 2000 (JP) ........................................ 2000-243079

(51) Int. Cl.$^7$ ............................................ H01L 27/108
(52) U.S. Cl. ........................ 257/296; 257/300; 257/307
(58) Field of Search ................................ 257/296, 300, 257/307

(56) References Cited

U.S. PATENT DOCUMENTS

| | | | | |
|---|---|---|---|---|
| 4,855,953 A | * | 8/1989 | Tsukamoto et al. | 257/296 |
| 5,592,009 A | * | 1/1997 | Hidaka | 257/351 |
| 6,075,720 A | * | 6/2000 | Leung et al. | 365/149 |

FOREIGN PATENT DOCUMENTS

| | | |
|---|---|---|
| JP | 6-302778 | 12/1994 |
| JP | 08046149 A | * 2/1996 ......... H01L/21/822 |

* cited by examiner

*Primary Examiner*—Allan R. Wilson
(74) *Attorney, Agent, or Firm*—Burns, Doane, Swecker & Mathis, LLP

(57) ABSTRACT

There is provided a semiconductor integrated circuit device comprising: a field placement creating a field pattern in an array form by closest packing on a first conductance-type semiconductor substrate, the field pattern including a plurality of memory cells which define an active area and a device isolation region of a field effect transistor, and which are arranged in a predetermined pitch in the longitudinal and transverse directions, respectively, each memory cell having a pattern of a certain length-to-width size; a cell plate placement providing a capacitor structure between a second conductance-type diffusion region formed by an impurity implant to the active area and a cell plate electrode formed so as to cover part of the active area with a predetermined cell plate pattern through a capacitor dielectric, the cell plate pattern extending in the transverse direction with a certain length size; and a word line placement in which a word line pattern is arranged in the transverse direction of a vacant zone of the active area in which the cell plate electrode is not formed and serves as a gate electrode of the field effect transistor on the active area, the word line pattern being formed through a gate oxide at a predetermined interval, wherein the layout of a cell array of the memory cells is provided by a closest packing cell configuration.

7 Claims, 21 Drawing Sheets

FIG.7

| Tox (nm) | CAPACITOR AREA | F (um) | nx≧2 | ny≧4 | CELL SIZE (F²) | CELL AREA (um²) |
|---|---|---|---|---|---|---|
| 5.00 | 5.43 | 0.18 | 2.00 | 170.59 | 341.19 | 11.05 |
| 5.00 | 5.43 | 0.18 | 3.00 | 86.80 | 260.39 | 8.44 |
| 5.00 | 5.43 | 0.18 | 5.00 | 44.90 | 224.49 | 7.27 |
| 5.00 | 5.43 | 0.18 | 6.00 | 36.52 | 219.11 | 7.10 |
| 5.00 | 5.43 | 0.18 | 7.00 | 30.93 | 216.52 | 7.02 |
| 5.00 | 5.43 | 0.18 | 8.00 | 26.94 | 215.53 | 6.98 |
| 5.00 | 5.43 | 0.18 | 9.00 | 23.95 | 215.54 | 6.98 |
| 5.00 | 5.43 | 0.18 | 10.00 | 21.62 | 216.21 | 7.01 |
| 5.00 | 5.43 | 0.18 | 15.00 | 14.97 | 224.56 | 7.28 |
| 5.00 | 5.43 | 0.18 | 20.00 | 11.82 | 236.41 | 7.66 |
| 5.00 | 5.43 | 0.18 | 40.00 | 7.30 | 291.89 | 9.46 |
| 5.00 | 5.43 | 0.18 | 60.00 | 5.84 | 350.43 | 11.35 |
| 5.00 | 5.43 | 0.18 | 80.00 | 5.12 | 409.71 | 13.27 |
| 5.00 | 5.43 | 0.18 | 90.00 | 4.88 | 439.48 | 14.24 |

FIG.8

| Tox (nm) | CAPACITOR AREA | F (um) | nx≧2 | ny≧4 | CELL SIZE (F²) | CELL AREA (um²) |
|---|---|---|---|---|---|---|
| 3.50 | 2.53 | 0.18 | 2.00 | 81.09 | 162.17 | 5.25 |
| 3.50 | 2.53 | 0.18 | 3.00 | 42.04 | 126.13 | 4.09 |
| 3.50 | 2.53 | 0.18 | 5.00 | 22.52 | 112.61 | 3.65 |
| 3.50 | 2.53 | 0.18 | 6.00 | 18.62 | 111.70 | 3.62 |
| 3.50 | 2.53 | 0.18 | 7.00 | 16.01 | 112.10 | 3.63 |
| 3.50 | 2.53 | 0.18 | 8.00 | 14.16 | 113.24 | 3.67 |
| 3.50 | 2.53 | 0.18 | 9.00 | 12.76 | 114.85 | 3.72 |
| 3.50 | 2.53 | 0.18 | 10.00 | 11.68 | 116.76 | 3.78 |
| 3.50 | 2.53 | 0.18 | 15.00 | 8.58 | 128.66 | 4.17 |
| 3.50 | 2.53 | 0.18 | 20.00 | 7.11 | 142.20 | 4.61 |
| 3.50 | 2.53 | 0.18 | 40.00 | 5.00 | 200.09 | 6.48 |
| 3.50 | 2.53 | 0.18 | 60.00 | 4.32 | 259.41 | 8.40 |
| 3.50 | 2.53 | 0.18 | 80.00 | 3.99 | 319.07 | 10.34 |
| 3.50 | 2.53 | 0.18 | 90.00 | 3.88 | 348.96 | 11.31 |

FIG.9

| Tox (nm) | CAPACITOR AREA | F (um) | nx≧2 | ny≧4 | CELL SIZE (F²) | CELL AREA (um²) |
|---|---|---|---|---|---|---|
| 2.00 | 1.15 | 0.18 | 2.00 | 38.49 | 76.99 | 2.49 |
| 2.00 | 1.15 | 0.18 | 3.00 | 20.75 | 62.24 | 2.02 |
| 2.00 | 1.15 | 0.18 | 5.00 | 11.87 | 59.37 | 1.92 |
| 2.00 | 1.15 | 0.18 | 6.00 | 10.10 | 60.59 | 1.96 |
| 2.00 | 1.15 | 0.18 | 7.00 | 8.92 | 62.41 | 2.02 |
| 2.00 | 1.15 | 0.18 | 8.00 | 8.07 | 64.56 | 2.09 |
| 2.00 | 1.15 | 0.18 | 9.00 | 7.44 | 66.93 | 2.17 |
| 2.00 | 1.15 | 0.18 | 10.00 | 6.94 | 69.44 | 2.25 |
| 2.00 | 1.15 | 0.18 | 15.00 | 5.54 | 83.03 | 2.69 |
| 2.00 | 1.15 | 0.18 | 20.00 | 4.87 | 97.36 | 3.15 |
| 2.00 | 1.15 | 0.18 | 40.00 | 3.91 | 156.40 | 5.07 |
| 2.00 | 1.15 | 0.18 | 60.00 | 3.60 | 216.10 | 7.00 |
| 2.00 | 1.15 | 0.18 | 80.00 | 3.45 | 275.94 | 8.94 |
| 2.00 | 1.15 | 0.18 | 90.00 | 3.40 | 305.89 | 9.91 |

SEMICONDUCTOR INTEGRATED CIRCUIT DEVICE AND METHOD OF MANUFACTURING THE SAME, AND CELL SIZE CALCULATION METHOD FOR DRAM MEMORY CELLS

BACKGROUND OF THE INVENTION

1. Field of the Invention

The present invention relates to a semiconductor integrated circuit device such as a system LSI incorporating DRAMs, a method of manufacturing the same, and a cell size calculation method for DRAM memory cells.

2. Description of the Prior Art

In recent years, a DRAM mixing or hybrid system LSI which integrates a logic such as processor, ASIC, or the like, and a large-scale DRAM on a common semiconductor substrate has been applied for many purposes. In such a system LSI, an internal data bus of multiple bits, e.g. 128–512 bits, makes an interconnection between the logic and the DRAM, thus achieving a data transmission speed which is higher by one to two orders, as compared to a case that a commercially available DRAM and a logic each having a small number of terminals are connected with each other on a common printed circuit board.

In addition, with respect to the logic, the number of external input pins may be reduced as compared to a system configuration which mounts externally the commercially available DRAMs. Further, a DRAM block is connected to a logic via an internal wiring inside the system LSI. Since the length of the internal wiring is sufficiently shorter than that of wirings on the printed circuit board, and also has a small parasitic impedance, charging and discharging currents can be drastically reduced, and signal transmissions can be carried out at high speed.

From these reasons, the DRAM hybrid system LSI has contributed greatly to the high performance of intelligence apparatuses that deal with a large amount of data of 3-D graphic processing, image and voice processing, and the like.

FIG. 17 is a schematic block diagram illustrating a configuration example of a conventional semiconductor integrated circuit device, which designates a DRAM mixing or hybrid system LSI. In FIG. 17, reference numeral 100 designates a power supply pin terminal for feeding power supply potential exVdd; 101 designates a large scale logic (LG); 102 designates an analog core (ACR); 103 designates a DRAM core (MCR); 104 designates a test interface circuit (TIC); 105 designates a first external pin terminal group (LPGA); 106 designates a second external pin terminal group (APG); and 107 designates a test pin terminal group (TPG).

The aforementioned system LSI includes: the large scale logic 101, connected to the first external pin terminal group, for executing a commanded processing; the analog core 102, connected between the large scale logic 101 and the second external pin terminal group 106, for executing a processing of analog signals; the DRAM core 103, connected to the large scale logic 101 via internal wirings, for storing data required by the large scale logic 101; and a test interface circuit 104 for executing a test operation for the DRAM core 103 through the test pin terminal group 107 while separating the large scale logic 101 and the DRAM upon a test mode. The DRAM core 103 receives a power supply voltage exVDD via the power supply pin terminal 100.

The analog core 102 includes a Phase-Locked Loop (PLL) for generating an internal clock signal; an analog/digital (A/D) converter for converting an externally inputted analog signal to a digital signal; and a digital/analog (D/A) converter for converting a digital signal supplied from the large scale logic 101 to an analog signal to be outputted.

FIG. 18 is a sectional schematic illustration taken along an arbitrary line in a large scale logic unit during a conventional DRAM-logic mixing process. In FIG. 18, reference numeral 201 designates a semiconductor substrate; 202 designates a first interlayer dielectric; 203a and 203b each designate a second interlayer dielectric; 204 designates a third interlayer dielectric; 205 designates a fourth interlayer dielectric; 206 designates a cover film; 211 designates a word line; 221 designates a bit line; 222 designates a first metal wiring; 223 designates a second metal wiring; 224 designates a third metal wiring; 231 designates a via plug such as tungsten W; 241 designates a contact hole; 242 designates a first through hole for connecting the first metal wiring 222 with the second metal wiring 223; and 243 designates a second through hole for connecting the second metal wiring 223 with the third metal wiring 224.

In FIG. 18, an n-channel or p-channel MOS transistor is first formed on the semiconductor substrate electrically separated by trench isolation. The gate electrode is formed by a wiring layer made of a silicon containing material, for example, polysilicon doped with an impurity or doped polysilicon, polycide such as tungsten silicide (WSix), and the like, and serves as the word line 211 through a microfabrication.

Metal wiring layers for multilevel metallization are formed by a metal such as aluminum Al or an alloy containing copper Cu therein on the upper layer of the MOS transistor with interposing the first to fourth interlayer dielectrics 202–205. These wiring layers are microfabricated independently to form the first metal wiring 222, second metal wiring 223, and third metal wiring 224.

These metal wirings 222–224 are electrically connected to the wiring layer of the bit line 221 formed by a material such as tungsten via the via plug 231 in which tungsten W or the like is buried in the contact hole 241 and through holes 242 and 243.

Note that the above-described bit line 221 is not required in a perfect CMOS logic process which mixes no DRAMs.

FIG. 19 is a schematic diagram of a memory cell array section of a DRAM core in a conventional semiconductor integrated circuit device, and FIG. 20 is a sectional schematic illustration taken along an arbitrary line in the longitudinal direction of the memory cell array of FIG. 19. In FIG. 19, reference numeral 301 designates a cell plate electrode CP; 302 designates a storage node contact; 303 designates a bit line contact; 305 designates a sense amplifier S/A; 310 designates a sub-word driver range (odd); 311 designates a sub-word driver range (even); 315 and 316 designate main word lines MWL<i> and MWL<i+1> (i=natural number), respectively; BL and ZBL designate a non-inversion bit line and an inversion bit line, respectively; and WL designates a word line, which connects with the main word line MWL via the logic gate.

The memory cell is typically composed of a capacitor for storing an electric charge and a field effect transistor (FET) or MOS transistor operating as a cell selection switch, and is called one transistor type. The gate electrode of this transistor is connected to the word line WL which feeds a selection signal of the memory cell, and controls the opening and closing of the memory cell. On the other hand, the drain of the transistor is connected to the bit lines BL and ZBL for cell information intake which are wired perpendicularly to the word line WL, and exchanges of data between memory cell and read or write circuit will be carried out through the drain.

In FIG. 20, the reference numeral 401 designates a semiconductor substrate 401; 402 designates a trench isolation region; 403 designates a word line; 403a designates a transistor gate wiring; 405 designates a configuration dummy bit line; 406 designates a bit line; 407 designates a storage node; 408 designates a cell plate electrode CP; 409a, 409b, and 411 each designate a contact buried by a via plug made of tungsten W; 410 designates a first metal wiring serving as a main word line; 412 designates a second metal wiring serving as a VCP power supply line; 421 designates a first interlayer dielectric; 422a and 422b each designate a second interlayer dielectric; and 423 designates a third interlayer dielectric.

Incidentally, a capacitor dielectric is formed between the storage node 407 and the cell plate CP 408, and these components construct a stacked capacitor to store a signal electric charge.

The operation will be next described below.

The sense amplifier S/A for amplifying a micro-signal is connected to each of the bit lines BL and ZBL, and the input/output of data to the external is carried-out through a multiplexer for selecting a specific bit line out of a plurality of bit lines BL and ZBL. A flip-flop is normally employed for the sense amplifier S/A, and a pair of bit line signals are inputted as a differential signal. The voltage of a reference signal which pairs with the bit line signal is generated through a dummy cell which is constructed by the same circuit as that of the memory cell.

On reading of the cell data, for example, after the bit line is changed to one potential, the word line WL to be selected is activated by a word line driver including the sub-word driver ranges 310 and 311, thus reading the charge stored in the capacitor to the bit line BL, while the reference voltage is given to the bit line ZBL pairing with the bit line BL. The sense amplifier S/A amplifies a voltage difference of the micro-signal which is caused by a difference between the bit line voltage on reading the cell data and the reference voltage, and the resultant is transferred to an output circuit through the multiplexer.

On the other hand, on writing of the cell data, the word line WL to be selected is activated and turns on or conduct a cell selection transistor, and it is carried out by taking in the cell a high or low potential level on the bit lines BL and ZBL.

A method of manufacturing the conventional semiconductor integrated circuit as shown in FIG. 20 is schematically described below.

A trench isolation region is first formed in the semiconductor substrate 401 to define an active region serving as a transistor region, and a transistor section is created through a plurality of ion implantation processes involving a resist pattern formation, and the word line 403 is formed on the transistor section. The first interlayer dielectric 421 is deposited on top, and a desired contact hole is opened by a microfabrication including photolithography and etching processes. Then a wiring layer is deposited on top by sputtering and the bit line 406 and configuration dummy bit line 405 are formed by the microfabrication as well.

Further, the second interlayer dielectric 422a is deposited on this topography and then opened by a desired contact hole. The storage node 407 is formed to be thoroughly in contact with the substrate 401. Further, the cell plate electrode 408 is formed on the storage node 407 with sandwiching the capacitor dielectric, finally effecting a conventional stacked capacitor structure.

Thereafter, the second interlayer dielectric 422b is formed on the topography and opened by through holes, and the via plugs made of tungsten W are buried in the through holes to form the contacts 409a and 409b. Then, the first metal wiring 410 is formed to electrically contact these contacts 409a and 409b, and finally, the third interlayer dielectric 423 is deposited and the second metal wiring 412 is finally formed on top.

Here, it should be noted that as to the layout of the memory cell of FIG. 19, a length where a minimum pitch length is projected to the column or bit line direction is equal to half of a layout pitch in the column direction of the memory cell. Note that the minimum pitch length is found when the bit line contacts are linked with each other in the slant direction. In addition, the bit line pair connecting the sense amplifier has a folded bit line configuration with strong noise resistance.

In the above-described cell size calculation method of DRAM memory cells, when it is designated by a minimum microfabrication dimension or F called feature size in design, a size ratio (length-to-width) is typically approximate to 2:1, and a 8F2 cell having 2F in width size and 4F in length size is employed.

In FIG. 20, an n-channel or p-channel MOS transistor constructing a memory cell transistor and an array control circuit is created on the semiconductor substrate 401 that is separated electrically by the trench isolation region 402. The gate electrode is formed by a wiring layer made of a silicon containing material such as doped polysilicon or polycide, e.g. WSix, which is the same layer as that of the word line 403, as well as the gate wiring 403a.

On top of this, the bit line 406 and a capacitor structure including layers of the storage node 407 and the cell plate 408 are formed. The bit line 406 is formed by a silicon containing material, for example, doped polysilicon or polycide such as WSix. Further, a multi-level metal wiring layer having the same structure as that of the logic unit or the first metal wiring 410 and second metal wiring 412 is formed through the contact 411 on the uppermost layer.

As shown in FIG. 20, a 3-D capacitor structure having such a complicated three dimensional structure as heightens the storage node is formed when the capacitor area is still larger to ensure the capacitance in the stacked capacitor. In this case, a large step height, however, occurs between the memory array section and the other peripheral circuit section, which makes it difficult to tight the wiring pitch in the metal wiring layers. For this reason, it is required to reduce drastically the aforementioned step height by introduction of a planarization process based on CMP (Chemical Mechanical Polishing).

Since the conventional semiconductor integrated circuit device, method of manufacturing the same, and cell size calculation method of DRAM memory cells are configured as described above, for example, in the DRAM hybrid system LSI, it is required to add newly a process step of forming wirings and electrodes which construct the capacitor section in the DRAM core and a planarization process step of reducing the step difference caused by the 3-D structure capacitor to normal CMOS logic processes. This leads to a large increase of the number of the total process steps, resulting in boosting the general chip cost.

On the other hand, there is an SRAM as a hybrid memory that can be formed by way of complete CMOS logic processes, and the SRAM has been applied to cache memories, register file memories, and the like with respect to a conventional processor.

Since the SRAM eliminates the following items: a refresh operation, which is necessary for DRAMS, every a refresh period of time; and a complicated memory control related to the refresh such that an access to the memory during refreshing must be on standby till the end of the refresh cycle, it is employed as a main memory for simplicity of the system configuration in portable information terminals and the like in the middle of serious requests for down sizing.

However, there is a drastically improved function in the portable information terminals, for example, managing even moving pictures recently, which requires a further large capacity memory.

That is, the shrinkage of the memory size in DRAMs makes progress in accordance with the development of microfabrication processes; for example, a cell size of 0.3 $\mu m^2$ has been already achieved in 0.18 $\mu m$ DRAM processes. On the other hand, the memory cell of the SRAM is constructed by six transistors together with p-channel and n-channel ones; even when the microfabrication processes make progress, the shrinkage of the memory size does not develop as much as that of DRAMs because of the restriction of an isolation distance between p-well and n-well; therefore, the memory size of the SRAM in 0.18 $\mu m$ CMOS logic processes is still the extent of 7 $\mu m^2$, which extends to twenty times the memory size of DRAMs as it stands.

As described above, since the chip size of the SRAM cannot help enlarging drastically in accordance with its large capacity development, which makes it hard extremely to hybridize 4 M (mega) or more SRAMs with logic circuits.

SUMMARY OF THE INVENTION

The present invention is implemented to solve the foregoing drawbacks. It is therefor an object of the present invention to provide a semiconductor integrated circuit device and a method of manufacturing the same, and a cell size calculation method of a DRAM memory cell in which the cell size of a DRAM memory cell is not as small as that of a typical DRAM memory cell but smaller sufficiently than that of a SRAM memory cell, and may be formed through a certain process near a process for CMOS logics, thus achieving a mixing memory capable of even a large capacity which is difficult for SRAMs.

A semiconductor integrated circuit device according to he present invention has the following characteristics:

Since the cell size of a DRAM memory cell is configured o be not as small as the typical memory cell size but smaller sufficiently than that of the SRAM in order to ensure a capacitor capacitance required for DRAM operations, a sufficiently large capacitor area is obtained even in a planar-type capacitor structure, and further a cell plate may be formed in the same layer as that of a word line serving as a gate electrode of a memory cell transistor; and furthermore, since a storage node for the capacitor is formed by a diffusion region on a semiconductor substrate, a step height may be eliminated completely between a memory cell array section and a peripheral circuit section.

According to a first aspect of the present invention, there is provided a semiconductor integrated circuit device comprising: a field placement creating a field pattern in an array form by closest packing on a first conductance-type semiconductor substrate, the field pattern including a plurality of memory cells which define an active area and a device isolation region of a field effect transistor, and which are arranged in a predetermined pitch in the longitudinal and transverse directions, respectively, each memory cell having a pattern of a certain length-to-width size;

a cell plate placement providing a capacitor structure between a second conductance-type diffusion region formed by an impurity implant to the active area and a cell plate electrode formed so as to cover part of the active area with a predetermined cell plate pattern through a capacitor dielectric, the cell plate pattern extending in the transverse direction with a certain length size; and a word line placement in which a word line pattern is arranged in the transverse direction of a vacant zone of the active area in which the cell plate electrode is not formed and serves as a gate electrode of the field effect transistor on the active area, the word line pattern being formed through a gate oxide at a predetermined interval, wherein the layout of a cell array of the memory cells is provided by a closest packing cell configuration.

Here, the pitch of the memory cell in the transverse direction may be loosened and at least two bit lines may be arranged for each pitch of the memory cell in the longitudinal direction.

The thickness of the capacitor dielectric may be the same as that of the gate oxide.

The capacitor dielectric may be made thinner than the gate oxide.

Another first conductance-type diffusion having a highly doped diffusion region may be provided under the diffusion region.

The capacitor structure may be a trench structure.

It is preferable that the first conductance-type is p-type and the second conductance-type is n-type, or the first conductance-type is n-type and that the second conductance-type is p-type.

According to a second aspect of the present invention, there is provided a method of manufacturing a semiconductor integrated circuit device comprising:

a first step of forming an active area and a device isolation region on the main surface of a semiconductor substrate and creating a field pattern of a memory cell array having a plurality of memory cells;

a second step of carrying out an impurity implant on the main surface to form a first conductance type well region which extends to a certain depth;

a third step of creating a resist pattern which covers art of the active area to form a second conductance-type diffusion region by carrying out the impurity implant through the resist pattern;

a fourth step of forming in turn a insulating film and an wiring layer each having a predetermined thickness after removing the resist pattern;

a fifth step of etching the wiring layer through a desired pattern created on the top for a microfabrication to form a gate electrode of a field effect transistor and a cell plate electrode;

a sixth step of forming insulating sidewalls to the gate electrode and the cell plate to form a highly doped diffusion region with the second conductance-type through a high-dose ion implant;

a seventh step of forming a first interlayer dielectric to open a contact hole therein by a microfabrication; and a eighth step of forming a metal wiring layer and creating a metal wiring from the wiring layer through a microfabrication.

Here, the third step may include a step of forming a highly doped diffusion region with the first conductance-type extending under the second conductance-type diffusion region.

The second step may include a step of forming another insulating film after formation of the well region and the third step includes a step of removing the another insulating film after formation of the second conductance-type diffusion region The first step may include a step of forming a trench within a section of the memory cell array.

It is preferable that the first conductance-type is p-type and the second conductance-type is n-type, or that the first conductance-type is n-type and the second conductance-type is p-type.

According to a third aspect of the present invention, there is provided a memory size calculation method for DRAM memory cells characterized in that a cell size of a planar-type capacitor in a memory cell laid out in accordance with a closest packing cell configuration is found based on a minimum microfabrication dimension.

According to a fourth aspect of the present invention, there is provided a memory size calculation method for DRAM memory cells that when the cell sizes in the transverse and longitudinal directions are represented nxF and nyF, respectively, based on a minimum microfabrication dimension F, and a capacitor area for a signal and a cell area are represented Scap and Scell, respectively, respectively, and under the conditions of $na \geq 2.5$, $nx \geq 2$ (integer), and $ny \geq 2$ (integer), the na, nx, and ny values are derived so as to bring the cell area Scell to a minimum based on the following formulae (1) and (2):

$$Scap = (nxF-F) \cdot (nyF-naF-0.5F) \quad (1)$$

$$Scell = nxF \cdot nyF \quad (2)$$

BRIEF DESCRIPTION OF THE DRAWINGS

FIG. 7 is a table showing calculation results from a cell size calculation method of a DRAM memory cell in accordance with the embodiment 1 of the present invention;

FIG. 8 is a table showing calculation results from the cell size calculation method of a DRAM memory cell in accordance with the embodiment 1 of the present invention;

FIG. 9 is a table showing calculation results from the cell size calculation method of a DRAM memory cell in accordance with the embodiment 1 of the present invention;

DETAILED DESCRIPTION OF THE PREFERRED EMBODIMENTS

An embodiment of the present invention will be described below.

EMBODIMENT 1

Figure 1:
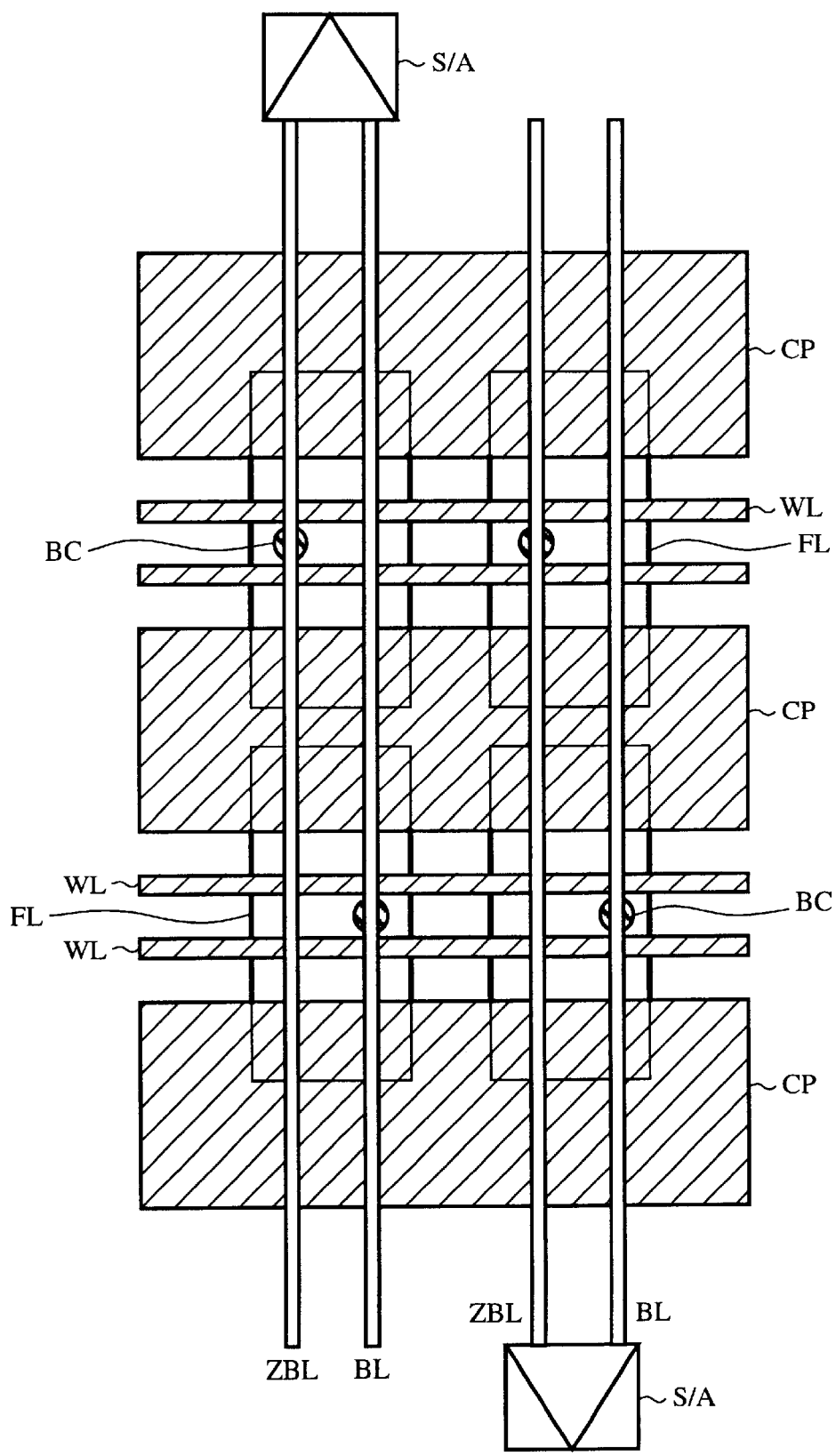
FIG. 1 is a layout diagram of a memory cell array of a semiconductor integrated circuit device in accordance with an embodiment 1 of the present invention.
Figure 2:
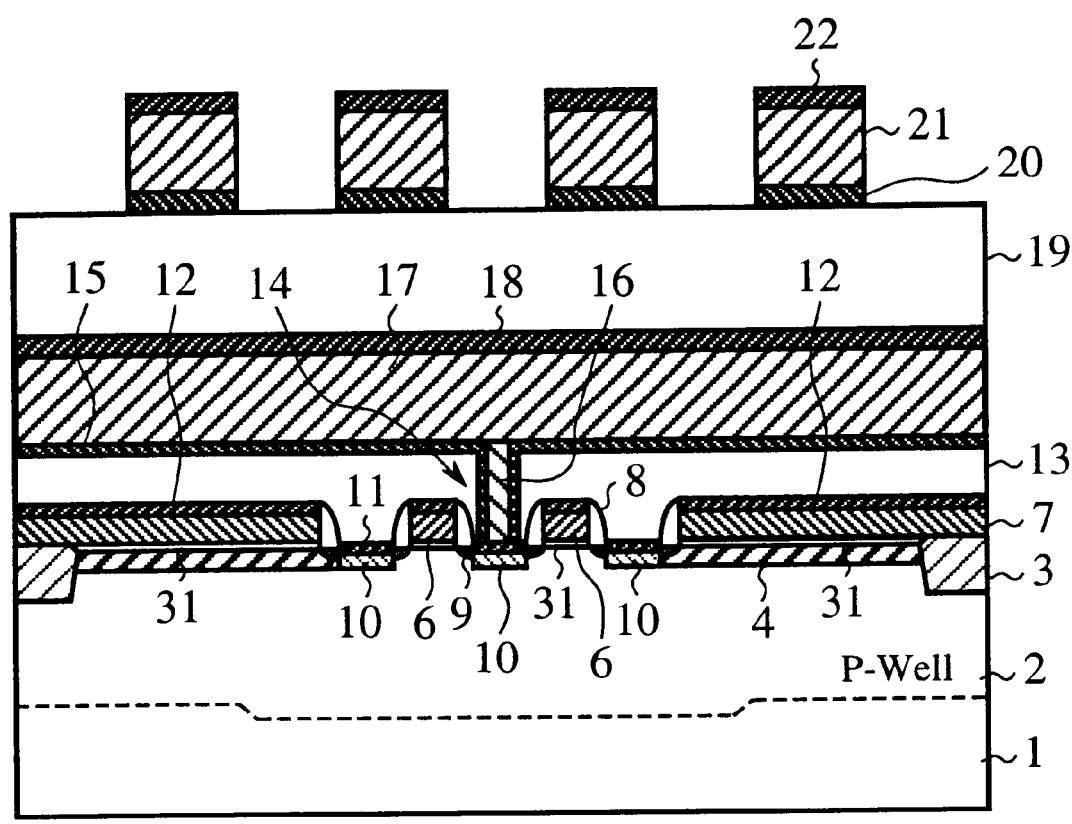
FIG. 2 is a sectional schematic illustration of a memory cell of the semiconductor integrated circuit device in accordance with the embodiment 1 of the present invention.

FIG. 1 is a layout diagram showing schematically the configuration of a memory cell array in a semiconductor integrated circuit device in accordance with an embodiment 1 of the present invention, and FIG. 2 is a sectional schematic illustration taken along an arbitrary longitudinal line passing a bit line contact BC of FIG. 1.

In FIGS. 1 and 2, reference symbol BC denotes a bit line contact; WL denotes a word line; BL denotes a non-inversion bit line; ZBL denotes an inversion bit line; CP denotes a cell plate electrode; and S/A denotes a sense amplifier. Reference numeral 1 designates a semiconductor substrate such as silicon; 2 designates a p-type well (including the channel-cut under the isolation region); 3 designates a device isolation region; 4 designates a n-type impurity region for a planar capacitor; 31 designates a gate oxide and a capacitor dielectric; 6 designates a gate electrode; 7 designates a cell plate electrode CP for the planar capacitor; 8 designates a insulating side wall; 9 designates an n– impurity region of a transistor; 10 designates an n+ impurity region of the transistor; 11 designates a metal salicide formed on the substrate 1; 12 designates a metal salicide formed on the gate electrode 6; 13 designates a first interlayer dielectric; 14 designates a bit line contact BC; 15 designates a first barrier metal layer; 16 designates a via plug made of CVD-W for hole burying; 17 designates a first aluminum wiring serving as the bit lines BL and ZBL; 18 designates a first antireflection film; 19 designates a second interlayer dielectric; 20 designates a second barrier metal layer; 21 designates a second aluminum wiring; and 22 designates a second antireflection film for photolithography.

Figure 20:
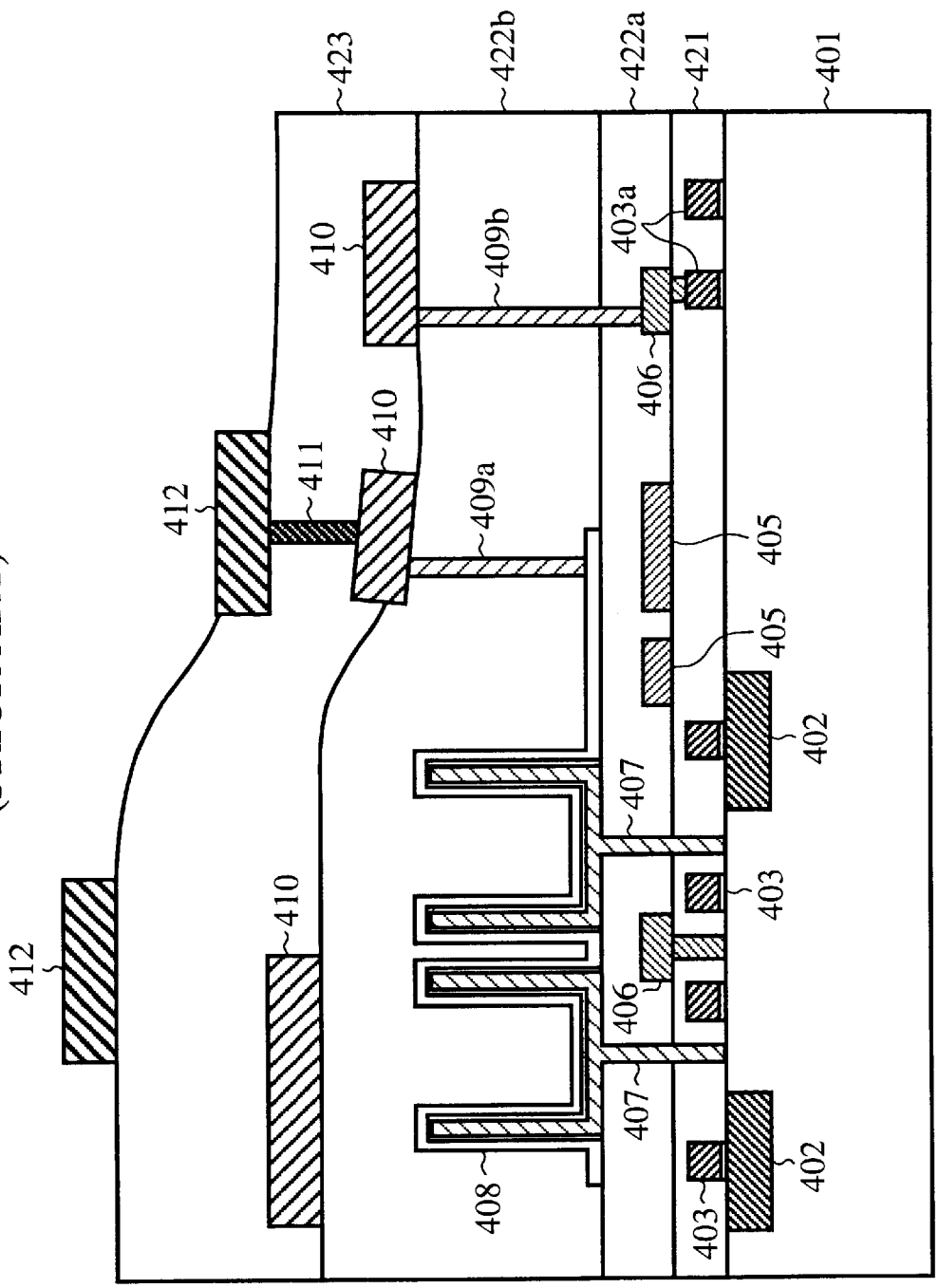
FIG. 20 is a schematic cross section of the memory cell array section in the conventional DRAM core.

In FIGS. 1 and 2, a sub-word line (corresponding to the above-described word line WL) serving as the cell plate electrode CP 7 and the gate electrode 6 is formed from the same wiring layer made of a silicon containing material of polycrystalline silicon doped with an impurity such as phosphorus P or doped polysilicon, polycide such as WSix, or the like. In addition, the storage node 407 in the stacked capacitor shown in FIG. 20 becomes a diffusion layer on the semiconductor substrate due to the planar capacitor structure.

The dielectrics under the word line WL and the cell plate electrode CP 7 are the gate oxide 31 and capacitor dielectric 31 of the memory cell transistor, respectively. Typically, the capacitor dielectric 31 is also formed from silicon dioxide; however, these oxide and dielectric may be formed as dioxides each having a different thickness through a dual-gate-oxide process, or only the capacitor dielectric 31 may be formed from a dielectric with a high dielectric constant such as $Ta_2O_5$. In addition, the bit lines BL and ZBL has a structure of CUB (Capacitor Under Bit line) which is formed on the upper layer of the cell plate electrode CP 7.

It is not required to add newly a wiring layer for the cell plate electrode CP 7 and storage node 407 (FIG. 20) unlike the prior art, and the cell plate electrode CP and word line WL are formed from the same wiring layer in the planar-type capacitor structure. Accordingly, there is no possibility to generate a step height between the memory array section and peripheral circuit section. Therefore, without any need of the introduction of a planarization process based on CMP and the like for alleviation of the step height, the memory cell array may be formed through processes near the CMOS logic processes.

The operation will be next described below.

The sense amplifier S/A for amplifying a micro-signal is connected to each of the bit lines BL and ZBL, and the data input/output to the external is carried out through the multiplexer for selecting a specific bit line out of the plurality of bit lines BL and ZBL. Flip-flops are typically employed for the sense amplifier S/A, and a pair of bit line signals are inputted as a differential signal. The voltage of a reference signal pairing with the bit line signal is generated by use of a dummy cell constituted by the same circuit as that of the memory cell.

On reading, for example, after the bit line is charged at a certain potential, the word line WL is activated through a word line driver. Then a signal charge stored in the capacitor including the capacitor dielectric 31 interposed between the impurity region 4 and cell plate electrode 7 is read out to the bit line BL via the contact BC 14, while a reference voltage is applied to the other, pairing bit line ZBL from the dummy cell. A voltage difference of the micro-signal based on a difference between the bit line voltage which is read out from the cell data and the reference voltage is amplified by the sense amplifier S/A, and the resultant is transferred to an output circuit through the multiplexer.

On the other hand, on writing, the selected word line is activated and the cell selection transistor is turned on or conducted. A high or low potential level on the bit lines BL and ZBL is taken within the cell.

Next, a method of manufacturing a semiconductor integrated circuit device in accordance with the embodiment 1 will be described referring to sectional process diagrams of FIG. 3.

In FIG. 3, reference numeral 30 designates a resist pattern; 31 designates a gate oxide; 32 designates a doped polysilicon doped by phosphorus P and so on; and 33 and 33a each designate a CVD oxide. The same other numerals as the above denote the same or corresponding parts and these redundant explanation will be omitted.

Figure 3A:
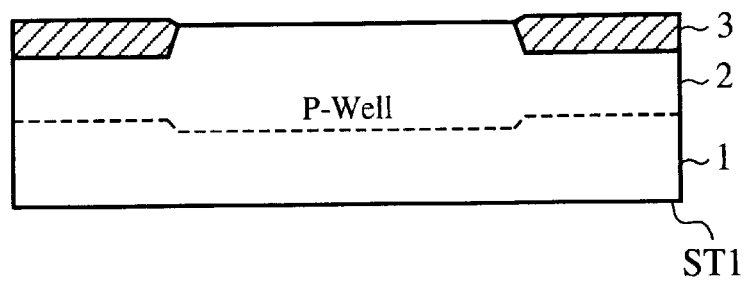
FIGS. 3A–3D are sectional process diagrams showing a method of manufacturing a semiconductor integrated circuit device in accordance with the embodiment 1 of the present invention.
Figure 3B:
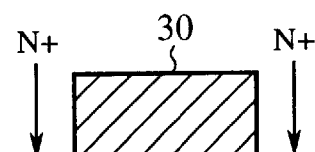
Figure 3B:
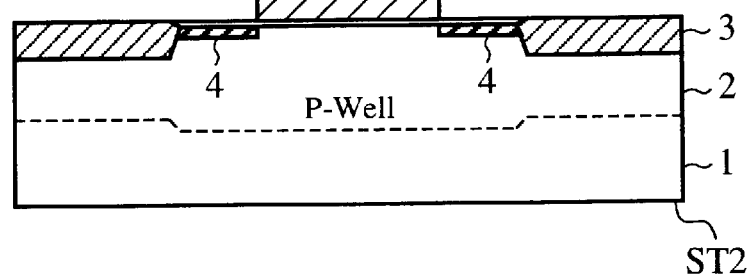
Figure 3C:
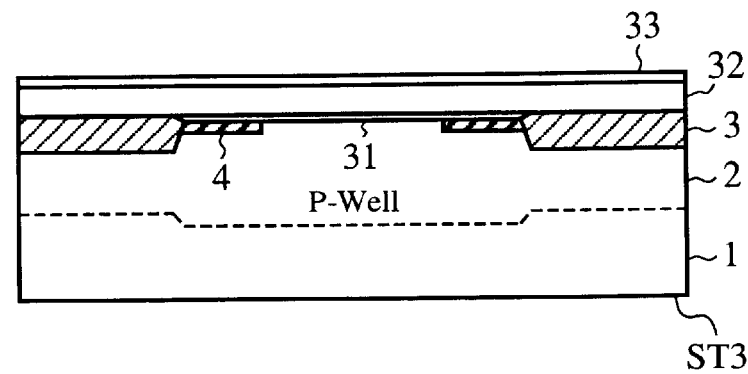
Figure 3D:
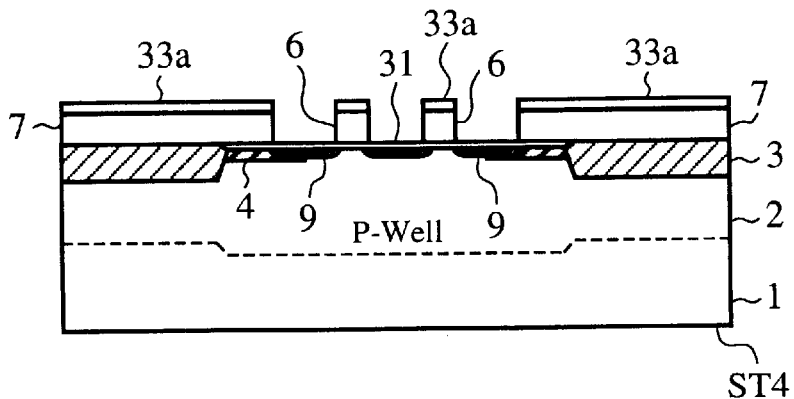

First, at Step ST1, after the device isolation region 3 is formed in a predetermined position on the substrate 1, p type well 2 is formed by- an impurity implant with a high energy (FIG. 3A); at Step ST2, after the n type impurity region 4 for storing a signal charge of DRAMs is formed within the active region by the n+ ion implantation after the formation of the resist pattern 30 (FIG. 3B). At Step ST3, the gate oxide 31 having a thickness of 2–8 nm is formed on the p type well of the substrate 1, phosphorous P doped polysilicon with a thickness of about 10 nm is formed on the top, and further a CVD oxide 33 is formed with a thickness of 10–15 nm to be stacked (FIG. 3C). At Step ST4, a desired resist pattern is created on the top, and the gate electrode 6 and the cell plate electrode 7 of the memory cell transistor are formed through a certain etching process (FIG. 3D).

Figure 3E:
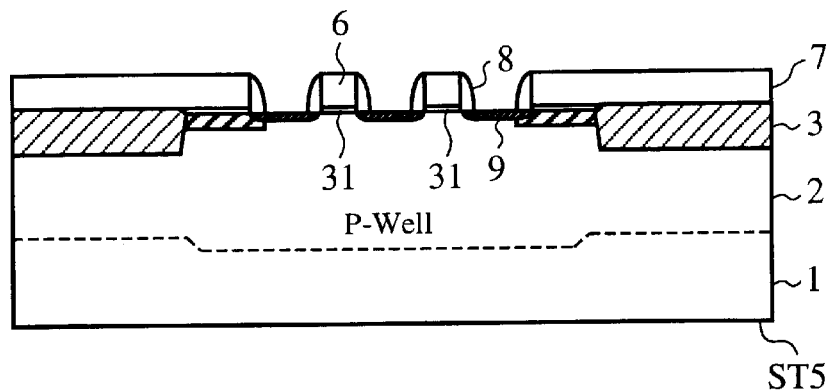
FIGS. 3E–3G are sectional process diagrams showing a method of manufacturing a semiconductor integrated circuit device in accordance with the embodiment 1 of the present invention.
Figure 3F:
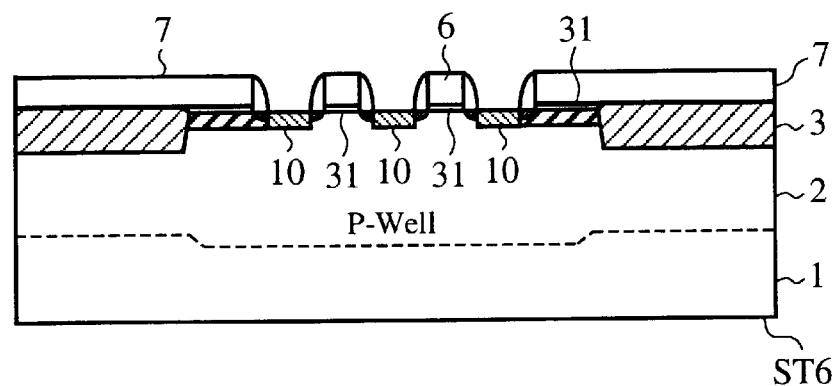
Figure 3G:
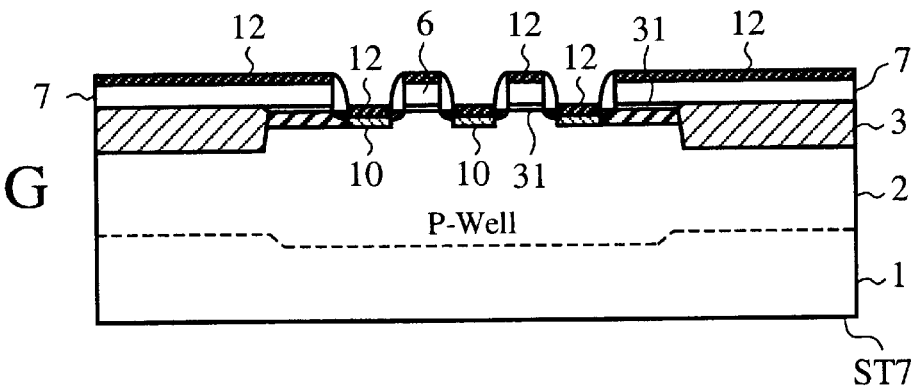

Subsequently, at Step ST5, an oxide is formed by a deposition with 10 nm thick and subjected to anisotropic dry etching, thus forming the sidewall 8 (FIG. 3E). At Step ST6, the n+ impurity region 10 is formed by an ion implantation. At Step ST7, the metal silicide film 12 is formed on the p-type well 2, gate electrode 6 and cell plate electrode 7 for a planar type capacitor of the substrate 1 (FIG. 3G).

Figure 3H:
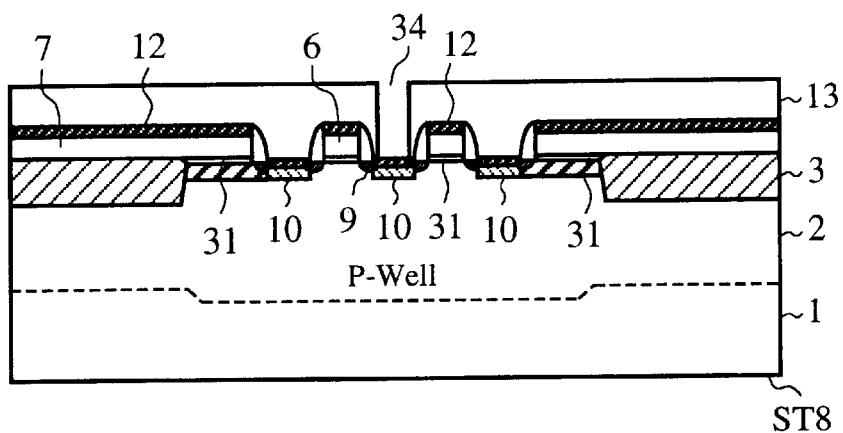
FIGS. 3H–3J are sectional process diagrams showing a method of manufacturing a semiconductor integrated circuit device in accordance with the embodiment 1 of the present invention.
Figure 3I:
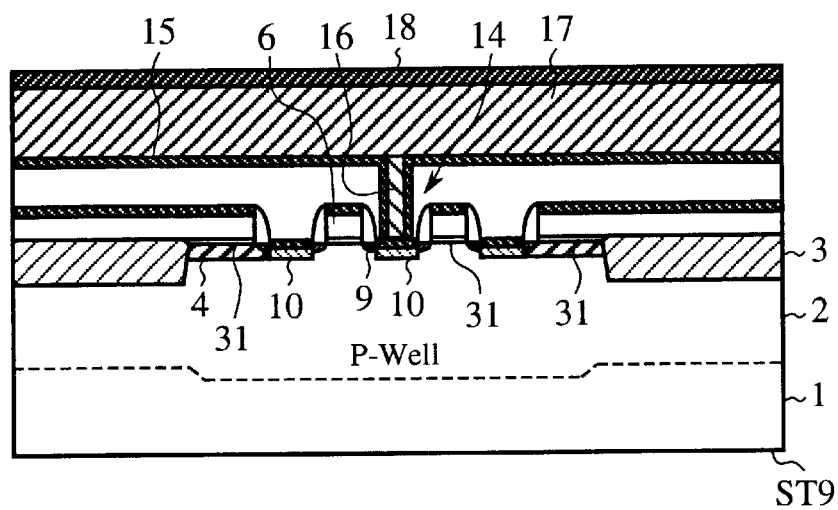
Figure 3J:
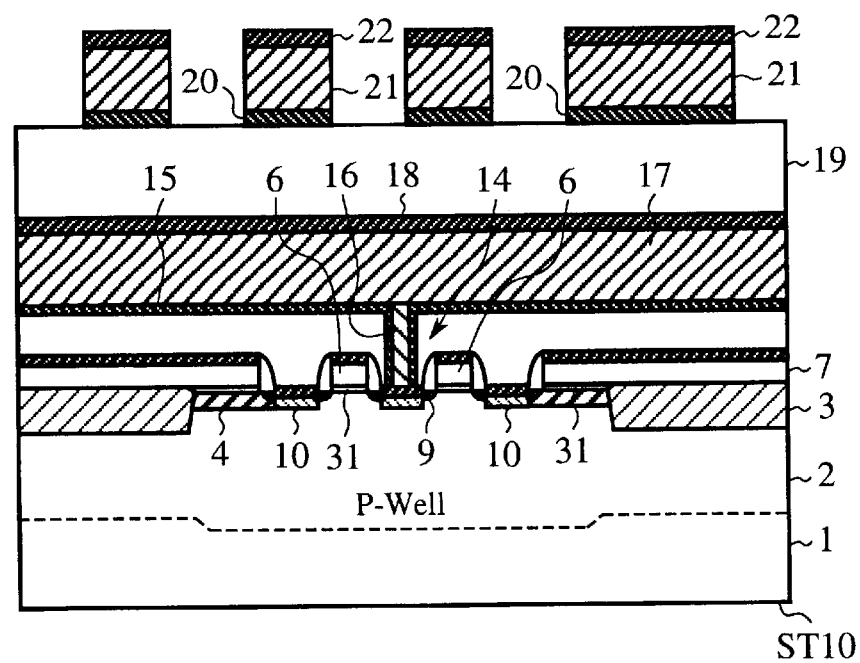

Further, at Step ST8, the first interlayer dielectric 13 is formed on the top, and the contact holes 34 and 35 are formed through photo lithography and etching (FIG. 3H). At Step ST9, the first barrier metal layer 15 is deposited by sputtering and CVD-W is then deposited for hole burying; these layers are subjected to blanket-etch back to form the via plug 16; thereafter an aluminum deposition layer and an antireflection film are in turn formed by sputtering; the first aluminum wiring 17 is formed by a microfabrication including photolithography and etching while the first antireflection film 16 is prepared on the top surface (FIG. 3I). Finally, at Step ST10, after the second interlayer dielectric 19 is formed on the top, the aluminum deposition layer and antireflection film are in turn formed similarly, and the second aluminum wiring 21 with the second antireflection film 22 on the upper surface is, created by a microfabrication (FIG. 3J).

A desired semiconductor integrated circuit in accordance with the embodiment 1 may be obtained through the aforementioned process flow.

The layout placement of the memory according to the feature in accordance with the embodiment 1 of the present invention will be next described.

As shown in FIG. 1, the memory cell in accordance with the embodiment 1 is configured by "closest packing cell placement", which may be achieved as follows.

Namely, in the field placement, a memory cell array having a plurality of memory cells is created by the closest packing cell placement when the memory cells are placed on the p-type well 2 of the p-type semiconductor substrate 1 with a predetermined pitch in the respective longitudinal and transverse directions to define the active area and device isolation region 3.

Then, in the cell plate placement, a capacitor structure is provided between a second conductive-type diffusion region formed in the active area by an impurity implantation and the cell plate electrode CP 7, which extends with the predetermined longitudinal size in the transverse direction and which is formed so as to cover part of the active area through the capacitor dielectric.

In addition, in the word line placement, the word line WL, which is formed through the gate oxide 31, is arranged in the transverse direction of a vacancy or spacing of the active area which is not formed with the cell plate electrode CP 7, and the gate electrode 6 of the MOS transistor is prepared on the active area.

The closest packing cell placement in a typical DRAM memory cell array can take just an open-type bit line structure having a weak noise resistance. However, as shown in FIG. 1, when the pitch in the row or transverse direction (word line direction) is loosened to arrange two bit lines per pitch of a memory cell, the folded bit line arrangement structure may be performed.

Figure 4:
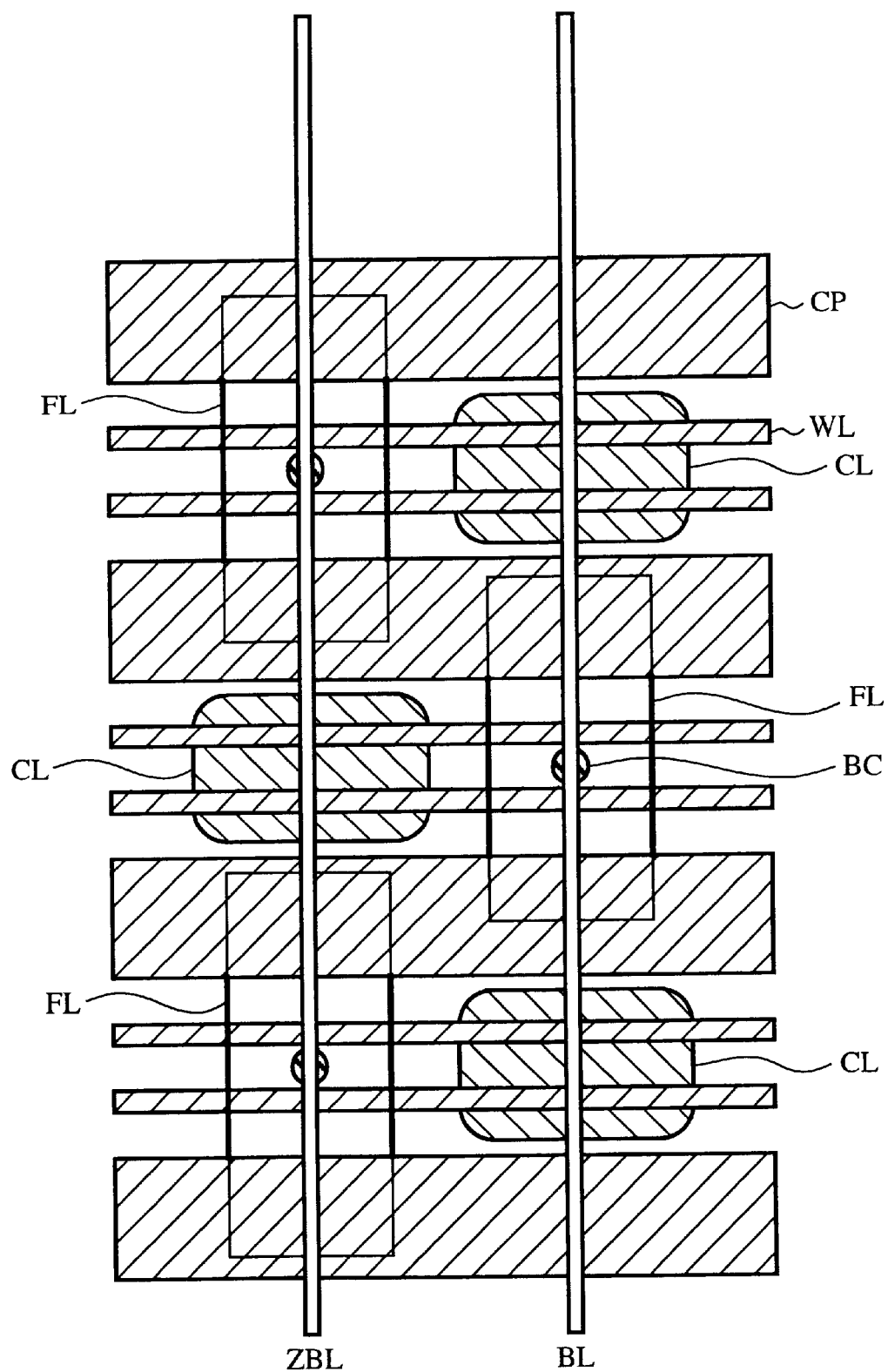
FIG. 4 is a layout diagram in which the memory cell array of a semiconductor integrated circuit device in accordance with the embodiment 1 of the present invention is applied to a half pitch cell configuration.

On the other hand, FIG. 4 is a layout diagram illustrating an arrangement which applies a memory cell to a half pitch cell configuration. In FIG. 4, reference symbol CL denotes a capacitor loss region, the same other numerals above designate the same components or corresponding parts, and their explanation will be omitted herein for brevity. As shown in FIG. 4, when in accordance with the conventional DRAM memory array, the word line WL and the cell plate CP electrode is formed by a common wiring layer, there occurs a wasteful region unusable for capacitors or capacitor loss region CL.

The size ratio in length-to-width is typically almost 2:1 in the memory cell of conventional DRAMs, which employ a 8F2 cell of 2F in width size and 4F in length size, for example. Here, F is a value called "feature size" in design and is provided by adding a margin (registration in transcription processes and the like) to a design basis (=minimum dimension).

Figure 5:
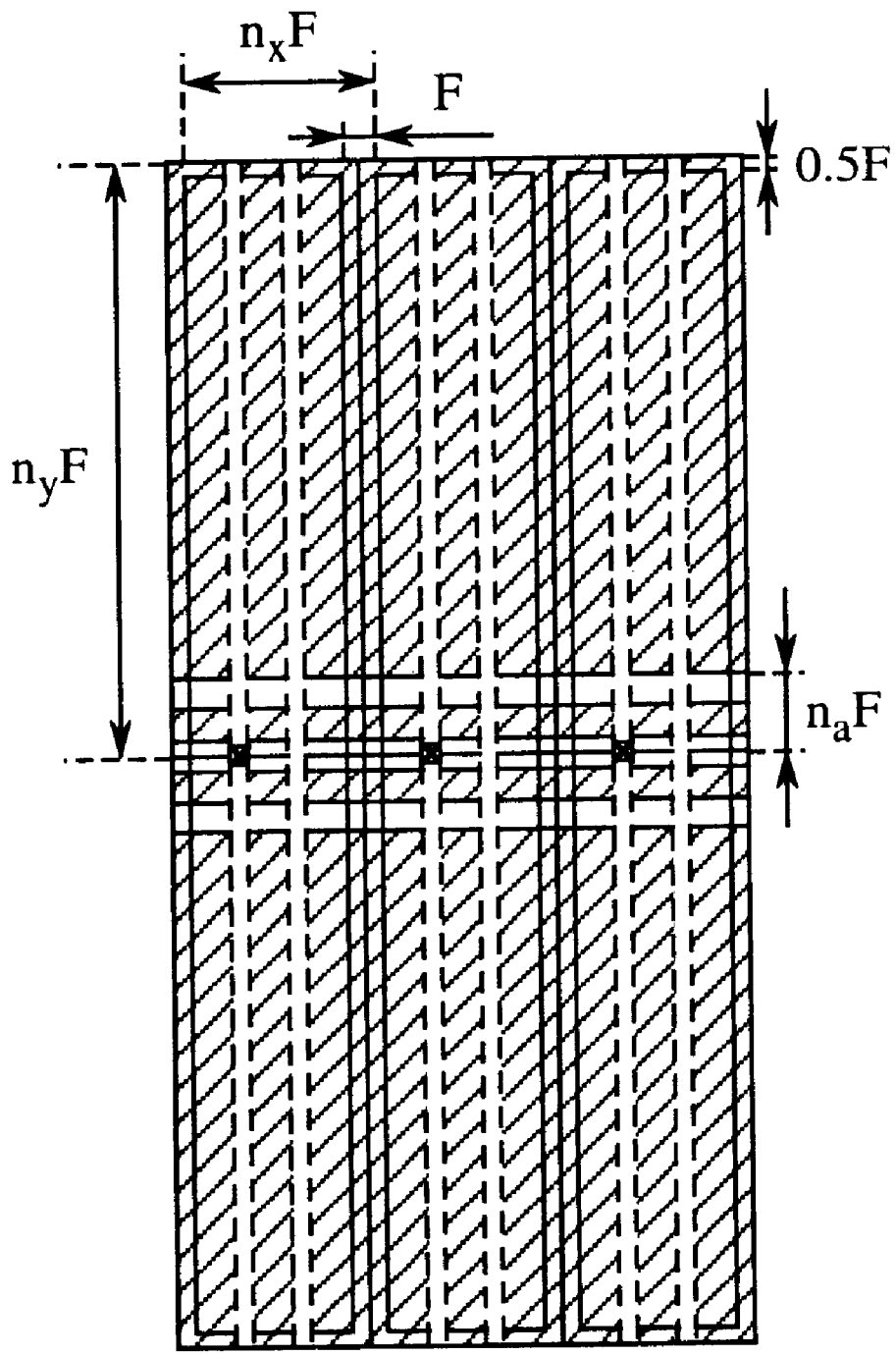
FIG. 5 is another illustration of a memory cell configuration.
Figure 6:
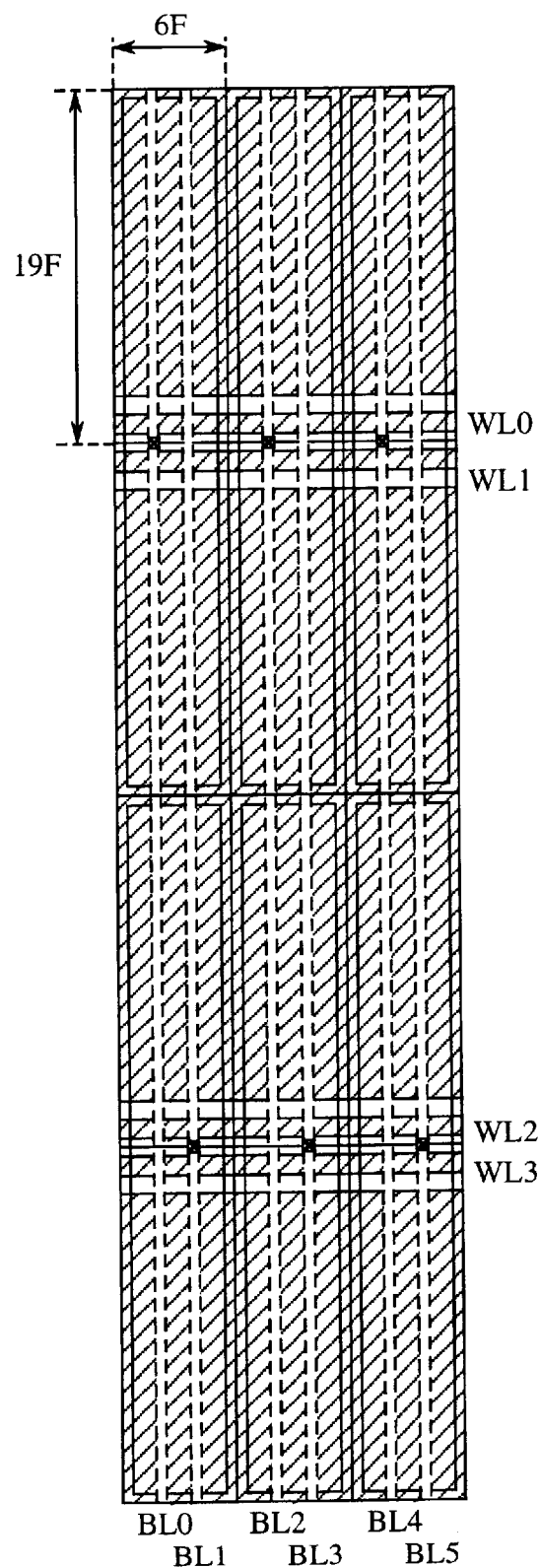
FIG. 6 is another illustration of a memory cell configuration.

Referring to FIGS. 5 and 6, an optimum cell size will be described based on the cell size calculation method of DRAM memory cells in the embodiment 1.

FIGS. 5 and 6 are other illustrations of memory cell configurations: FIG. 5 corresponds to nx×ny F2 folded-BL mode, while FIG. 6 corresponds to 6×15 $F^2$ folded-BL mode.

In FIGS. 5 and 6, reference symbols WL0-WL3 and BL0-BL5 denote word lines in the transverse direction and bit lines in the longitudinal direction, respectively. When the cell size in the transverse direction (word line direction) is symbolized by nxF and the cell size in the longitudinal direction (bit line direction) by nyF, the area Scap of the planar-type capacitor is provided by the following formula (1):

$$Scap = (nxF - F) \cdot (nyF - naF - 0.5F) \quad (1)$$

where $na \geq 2.5$, $nx \geq 2$, and $ny \geq 4$; both nx and ny are integers; F denotes minimum microfabrication dimension, Scap denotes capacitor area for a signal.

In addition, the cell area Scell is provided by the following formula (2):

$$Scell = nxF \cdot nyF \quad (2)$$

From the above formulae (1) and (2), the na, nx, and ny values may be introduced to minimize the cell area Scell.

The necessary condition to ensure a capacitor capacitance 25 fF required for a DRAM memory cell is searched for, for example, the respective conditions of the capacitor dielectric Tox=5 nm, 3.5 nm, and 2 nm on a oxide basis when F=0.18 μm. The cell size calculation results of the corresponding DRAM memory cell are shown in tables of FIGS. 7–9 (calculation values when na=2.5).

According to these, the following will be understood: When Tox=5 nm, the minimum cell size can be achieved by 6.98 7 $\mu m^2$ (width size=8F, length size=27F); when Tox=3.5 nm, the minimum cell size by 3.62 7 $\mu m^2$ (width size=6F, length size=19F); when Tox=2 nm, the minimum cell size by 1.92 7 $\mu m^2$ (width size=5F, length size=12F).

As described above, according to the embodiment 1, since in the field placement, the arrayed field patterns including the memory cells are created through the closest packing manner, and the cell plate electrodes CP 7 constructing the capacitor structure and the word line serving as the gate electrode 6 are provided by the cell plate and word line placements, respectively, the resultant memory cell may be laid out by the closest packing configuration which reduces extremely the capacitor loss region. In such a way, the aspect ratio of the memory cell can be enlarged drastically as compared to the conventional DRAM, thereby achieving a DRAM memory cell having a memory size smaller sufficiently than that of SRAMs.

In addition, in each memory of the field pattern in the field placement, the pitch in the transverse direction is loosened, and the bit lines BL and ZBL arranged in the longitudinal direction are provided with at least two lines every the pitch, thereby achieving a folded-type bit line configuration with a strong noise resistance.

Further, since the word line serving as the gate electrode 6 and the cell plate electrode 7 are created by microfabrication of the wiring layer formed through the same process step, the DRAM memory cell may be formed through the LOGIC processes with ease.

EMBODIMENT 2

Figure 10:
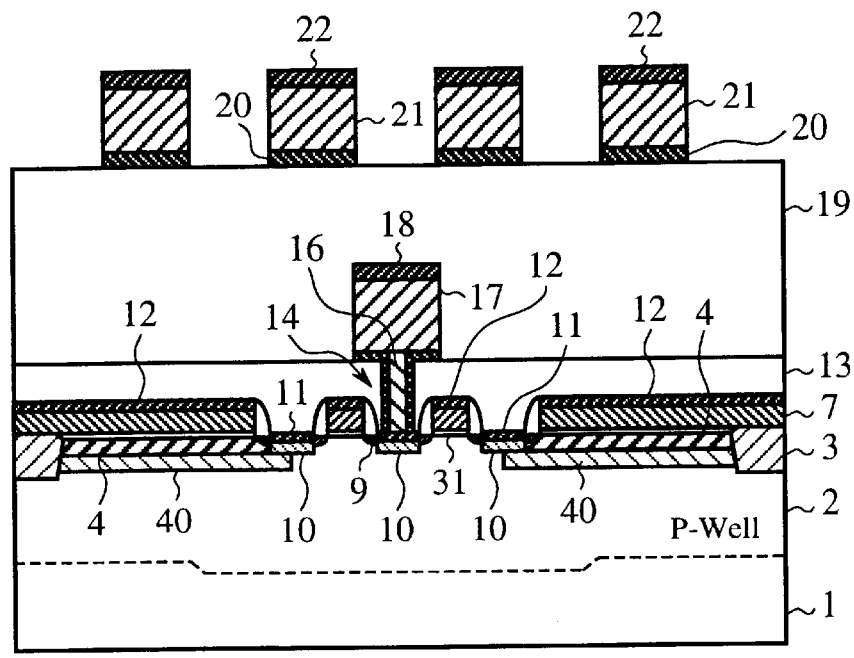
FIG. 10 is a schematic cross section of a memory cell of a semiconductor integrated circuit device in accordance with an embodiment 2 of the present invention.

FIG. 10 is a schematic cross section of a semiconductor integrated circuit device in accordance with an embodiment 2 of the present invention. In FIG. 10, reference numeral 40 designates a highly doped impurity region for increasing a coupling capacitance. The same other numerals above designate the same components or corresponding parts and their explanation will be omitted herein for brevity, which is similar in the following.

In the semiconductor integrated circuit device of the embodiment 2, there is a feature in that in the memory cell structure of the embodiment 1, the p+ highly doped impurity region 40 for increasing the coupling capacitance is provided under an impurity region 4 for a planer capacitor. This achieves a memory cell having a Hi-C structure, what is called, and enlarges the capacitance of the node which stores data so as to prevent the data destruction within the memory cell due to soft errors.

Next, a method of manufacturing a semiconductor integrated circuit device in accordance with the embodiment 2 will be described with reference to the sectional process flow diagram of FIG. 11. In the drawing, reference numeral 30 designates a resist pattern; 31 designates a gate oxide; 32 designates a p-doped polysilicon which is doped with phosphorous P; 33 and 33a each designate a CVD oxide. The same other numerals above designate the same components or corresponding parts and their explanation will be omitted.

Figure 11A:
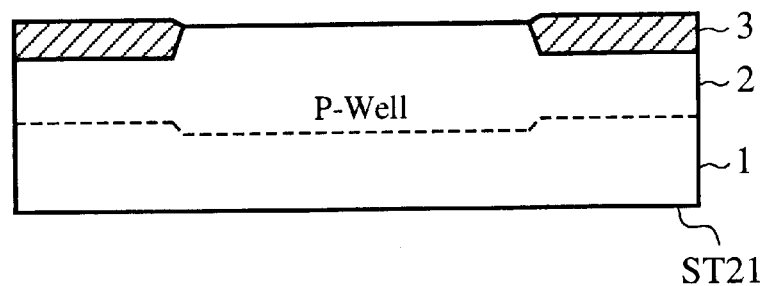
FIGS. 11A–11D are sectional process diagrams showing a method of manufacturing a semiconductor integrated circuit device in accordance with the embodiment 2 of the present invention.
Figure 11B:
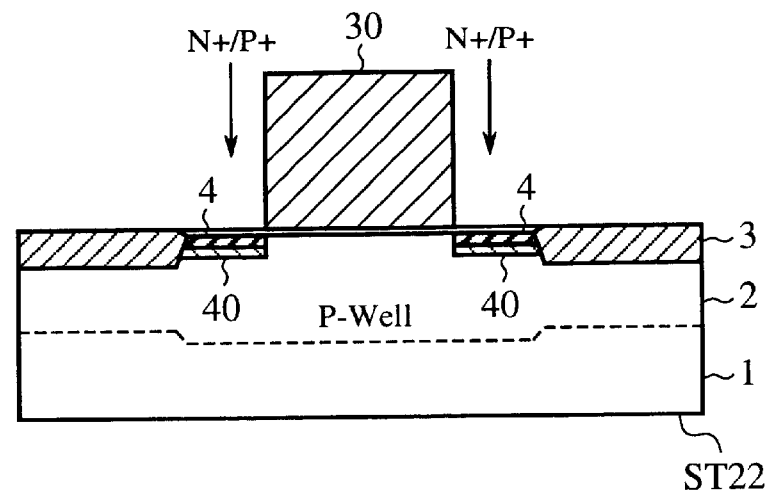

First, at Step ST21, a device isolation region 3 is formed at a predetermined position on a semiconductor substrate 1, and then a p-type well 2 is formed by a high-energy impurity implantation (FIG. 11A); at Step ST22, after formation of the resist pattern 30, the n-type impurity region 4 and p+ impurity region 40 for storing a signal charge of a DRAM are formed in an active area by n+/p+ ion implants (FIG. 11B).

Figure 11C:
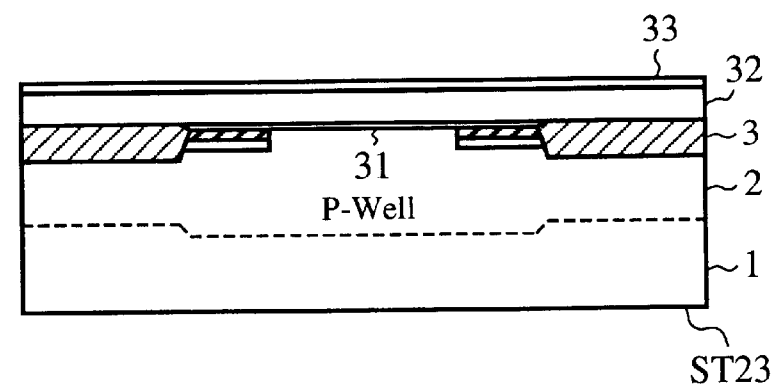
Figure 11D:
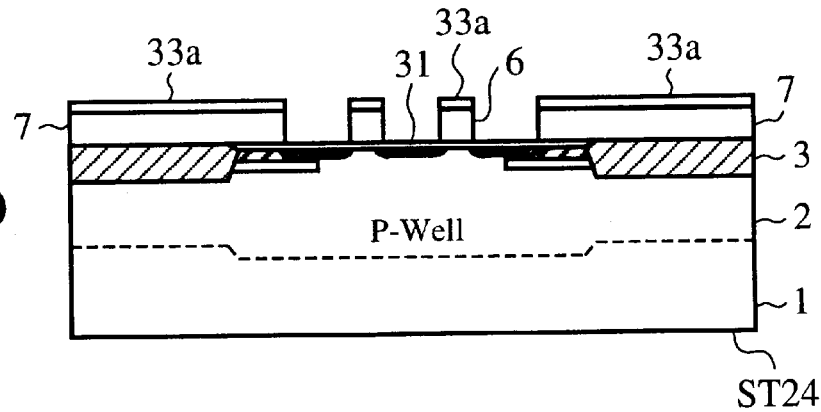

Then, at Step ST23, the gate oxide 31 is formed with a thickness of 2–5 nm on the p-type well 2 in the substrate 1; the p-doped polysilicon 32 about 10 nm thick is formed on top; further, the CVD oxide 33 is formed and stacked with a thickness of 10–15 nm (FIG. 11C). On the top, at Step ST24, a desired resist pattern is created and etching process is implemented through the pattern, thus forming the gate electrode 6 and cell plate 7 of the memory cell transistor (FIG. 3D).

However, subsequent steps are the same as those of the embodiment 1, and these explanation will be omitted.

By way of the aforementioned process flow, a desired semiconductor integrated circuit device in accordance with the embodiment 2 will be obtained.

As described above, according to the embodiment 2, in the memory cell structure, the p+ highly doped impurity region 40 is created under the impurity region 4 for the planar capacitor to increase the coupling capacitance, thus achieving the Hi-C structure. In such a way, the signal charge stored in the capacitor increases, thereby shrinking the cell size.

EMBODIMENT 3

Figure 12:
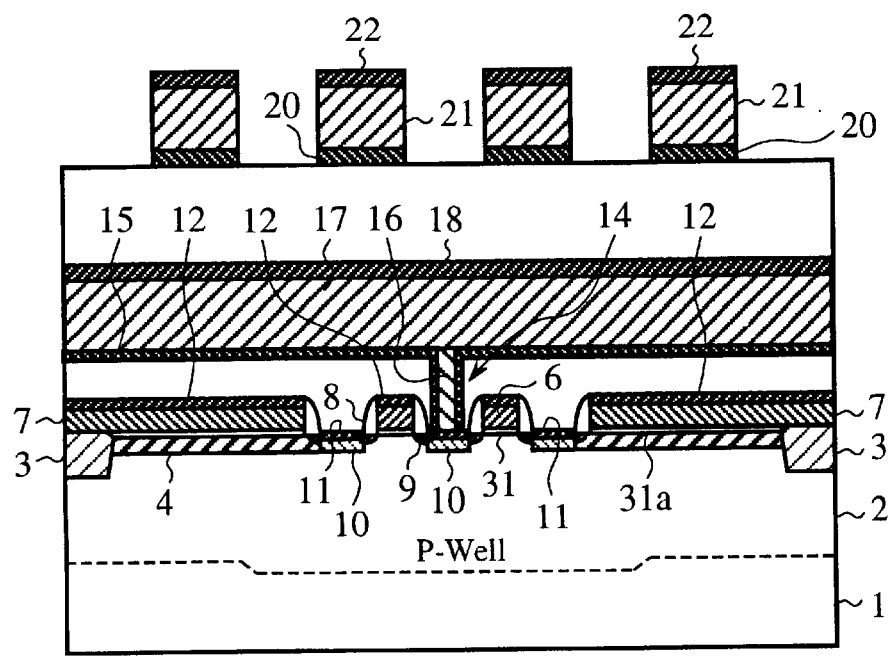
FIG. 12 is a schematic cross section of a memory cell of a semiconductor integrated circuit device in accordance with an embodiment 3 of the present invention.

FIG. 12 illustrates a schematic cross section of a semiconductor integrated circuit device in accordance with an embodiment 3 of the present invention, which illustrates the sectional structure of a PDR memory cell. In FIG. 12, reference numeral 31 designates a gate oxide for a MOS transistor; and 31a designates a capacitor dielectric for a signal charge storage capacitor. Note that other components are the same as the embodiment 1.

The semiconductor integrated circuit device of the embodiment 3 has the following feature: In the memory cell structure, the thickness of the capacitor dielectric 31a for the signal charge storage capacitor is formed thinner than that of the gate oxide 31 for the MOS transistor; thus the area of the capacitor may be reduced and the storing amount of the charge may be enhanced.

Next, a method of manufacturing a semiconductor integrated circuit device in accordance with the embodiment 3 will be described with reference to the sectional process flow diagram of FIG. 13.

Figure 13A:
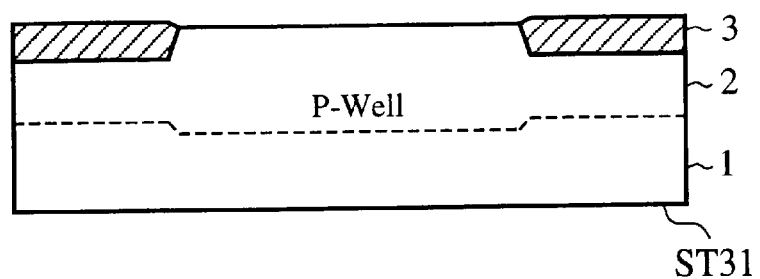
FIGS. 13A–13D are sectional process diagrams showing a method of manufacturing a semiconductor integrated circuit device in accordance with the embodiment 3 of the present invention.
Figure 13B:
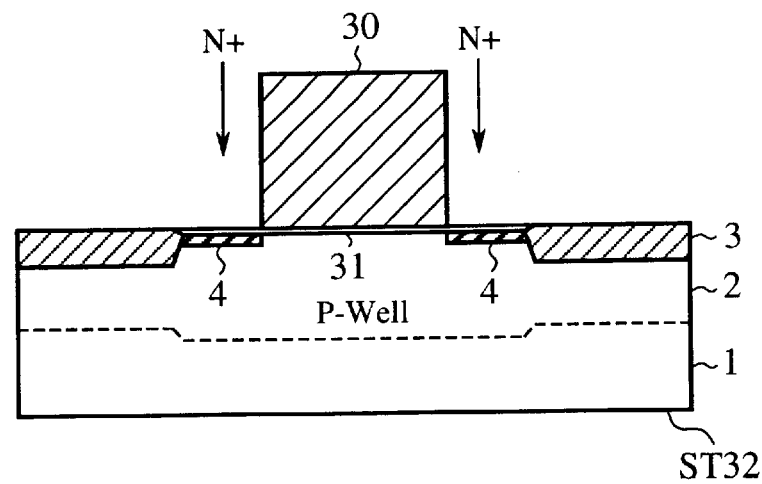

First, at Step ST31, a device isolation region 3 is formed at a predetermined position on a substrate 1, and then a p-type well 2 is formed by an impurity implant with a high energy (FIG. 13A); at Step ST32, a resist pattern 30 is formed, and then a n-type impurity region 4 for storing a signal charge of a DRAM is formed in an active area by an n+ ion implant (FIG. 13B).

Figure 13C:
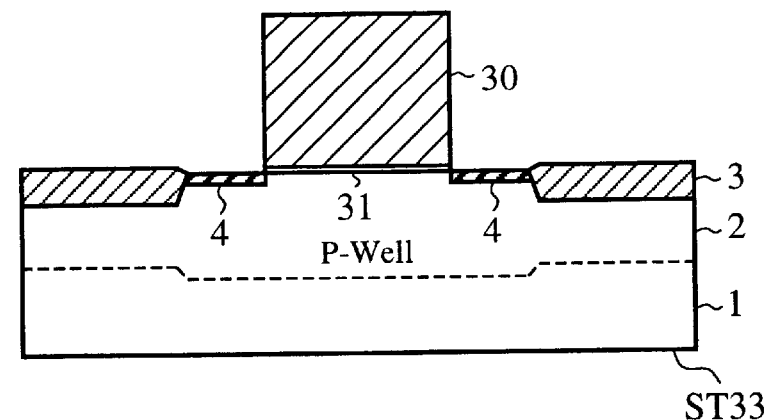
Figure 13D:
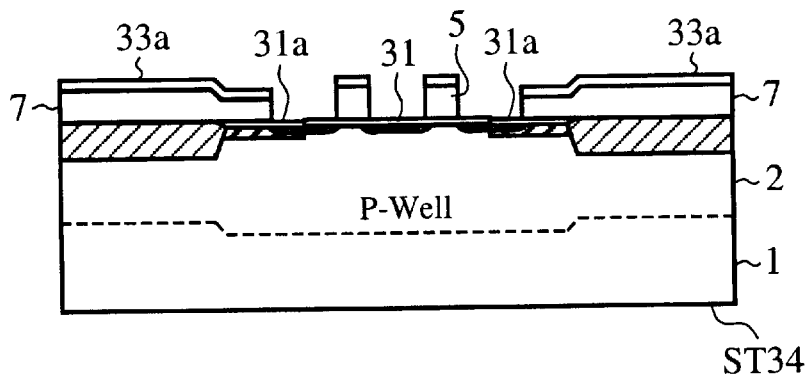

Then, at Step ST33, the gate oxide 31 is formed with a thickness of 2–8 nm on a p-type well 2 of the substrate 1; a p-doped polysilicon 32 is formed about 10 nm thick on top; further a CVD oxide 33 is formed and stacked thereon with a thickness of 10–15 nm (FIG. 13C). On top of this, at Step ST34, a desired resist pattern is formed and an etching process is then carried out to the resultant for lithography, thus forming a gate electrode 6 and a cell plate electrode 7 of a memory cell transistor (FIG. 13D).

However, subsequent steps are the same as those of the embodiment 1 and these explanation will be omitted.

By way of the aforementioned process flow, a desired semiconductor integrated circuit device in accordance with the embodiment 3 will be obtained.

As described above, according to the embodiment 3, in the memory cell structure, the thickness of the capacitor dielectric 31a is formed thinner than that of the gate oxide 31 for the MOS transistor, which may reduce the capacitor area and enhance the charge amount thereof, thereby performing the shrinkage of the cell size.

EMBODIMENT 4

Figure 14:
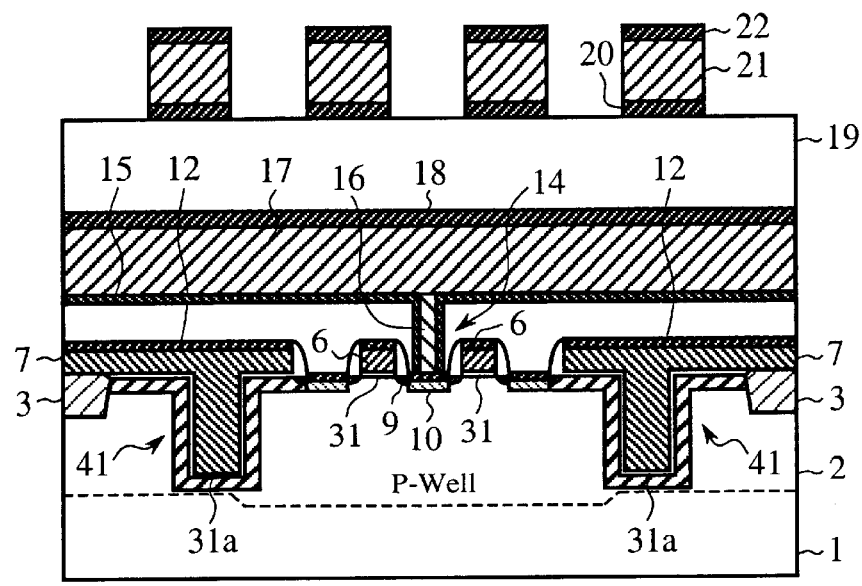
FIG. 14 is a schematic cross section of a memory cell of a semiconductor integrated circuit device in accordance with an embodiment 4 of the present invention.

FIG. 14 illustrates a schematic cross section of a semiconductor integrated circuit device in accordance with an embodiment 4 of the present invention, which illustrates the sectional structure of a PDR memory cell. In FIG. 14, reference numeral 41 designates a trench-type capacitor for a signal electric charge. Note that the other components are similar to those of the embodiments 1 and 3.

That is, the semiconductor integrated circuit device of the embodiment 4 has a feature that since the signal charge capacitor has a trench structure and trench-type capacitor in the memory cell structure, the cell size may be remarkably shrunk. Further, the thickness of the capacitor dielectric 31a is formed thinner than that of the gate oxide 31 for MOS transistors, resulting in a synergy effect of shrinking the capacitor area and enhancing the amount of storing the charge.

In this case, a manufacturing method of the semiconductor integrated circuit device according to the embodiment 4 has the same as that of the embodiment 1 except for adding only a step of creating the trench structure after the formation of the p-type well 2 by etching to the step ST1 of the embodiment 1, and thereby the explanation will be omitted.

As described above, since the embodiment 4 has the trench-type capacitor structure and the thickness of the capacitor dielectric 31a is formed thinner than that of the gate oxide 31 in the memory cell structure, the capacitor area may be decreased and the charge stored amount may be enhanced, and further when the gate electrode 6 and the cell plate electrode 7 is formed through the same process, the DRAM memory cell may be created with ease as well as the process for logic circuits.

EMBODIMENT 5

Figure 15:
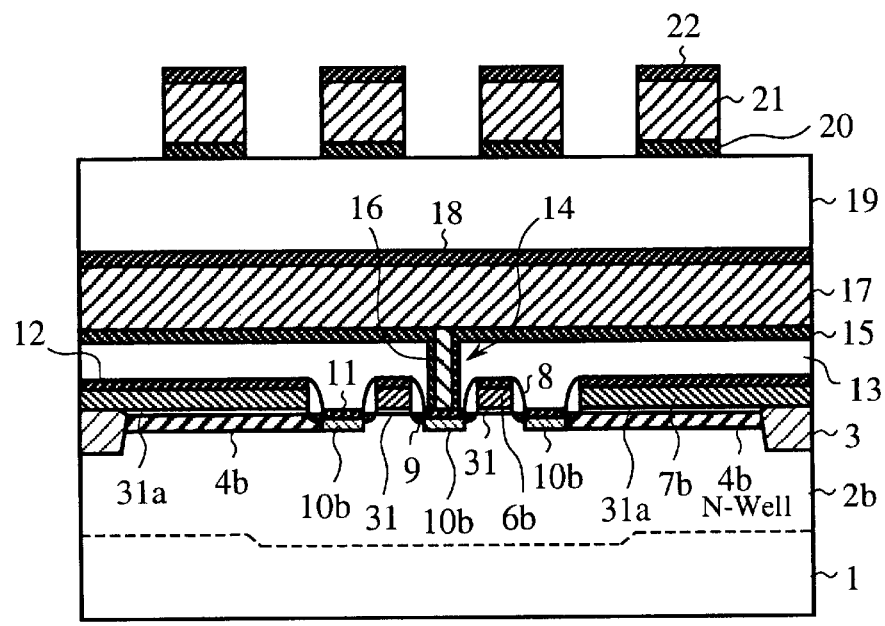
FIG. 15 is a schematic cross section of a memory cell of a semiconductor integrated circuit device in accordance with an embodiment 5 of the present invention.

FIG. 15 illustrates a schematic cross section of a semiconductor integrated circuit device in accordance with an embodiment 5 of the present invention, which illustrates the cross section of a p-channel-type PDRAM memory cell.

In FIG. 15, reference. numeral 1 designates a semiconductor substrate; 2b designates an n-type well (including a channel cut region under the isolation); 3 designates a device isolation region made of a dielectric such as oxide; 4b designates an impurity region for a planar capacitor; 31 designates a gate oxide; 31a designates a capacitor dielectric; 6b designates a gate. electrode; 7b designates a cell plate electrode for the planar capacitor; 8 designates a dielectric for sidewalls; 9 designates a n-impurity region of a transistor; 10b designates a p+ impurity region of the transistor; 11 designates a metal salicide formed on the substrate 1; 12 designates a metal salicide formed on the gate electrode 6b; 13 designates a first interlayer dielectric; 14 designates a bit line contact BC; 15 designates a first barrier metal layer; 16 designates a via plug made of CVD-W for hole burying; 17 designates a first aluminum wiring serving as bit lines BL and ZBL; 18 designates a first antireflection film for photolithography; 19 designates a second interlayer dielectric; 20 designates a second barrier metal layer; 21 designates a second aluminum wiring; and 22 designates a second antireflection film for photolithography.

Next, a method of manufacturing a semiconductor integrated circuit device in accordance with the embodiment 5 will be described with reference to the sectional process flow diagrams of FIG. 16. In the drawings, the reference numeral 30 designates a resist pattern; 31 designates a gate oxide; 32b designates a p-doped polysilicon doped with phosphorous P; and 33 and 33a each designate a CVD oxide. The same other numerals described above denote the same or corresponding parts and these explanation will be omitted.

Figure 16A:
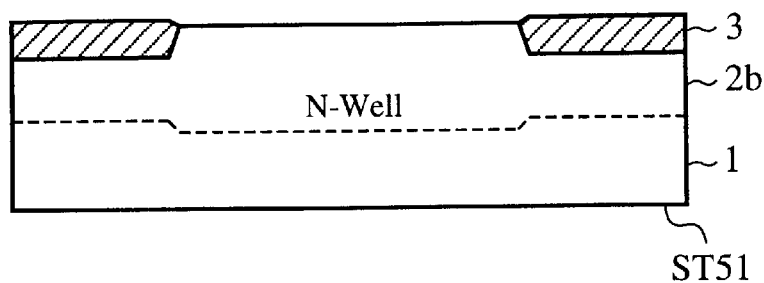
FIGS. 16A–16D are sectional process diagrams showing a method of manufacturing a semiconductor integrated circuit device in accordance with the embodiment 5 of the present invention.
Figure 16B:
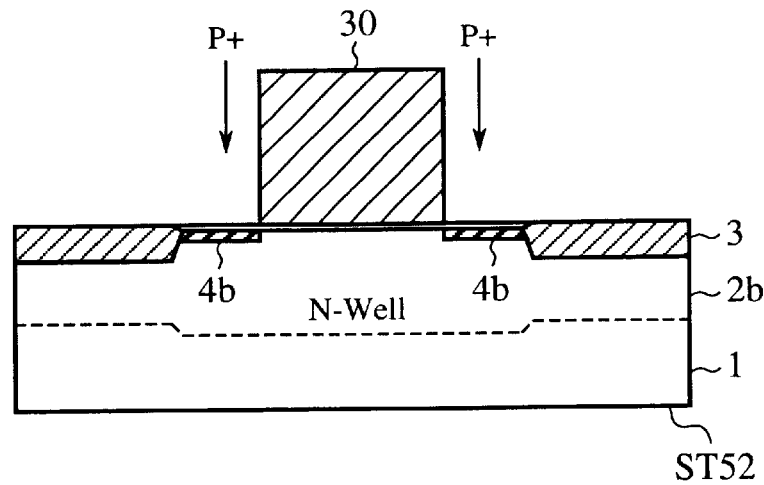

First, at Step ST51, a device isolation region 3 is formed at a predetermined position on a substrate 1, and then a n-type well 2b is formed by an impurity implant with a high energy (FIG. 16A); at Step ST52, an impurity region 4b for storing a signal charge for a DRAM is formed within an active region by a p+ ion implant after the formation of the resist pattern 30 (FIG. 16B).

Figure 16C:
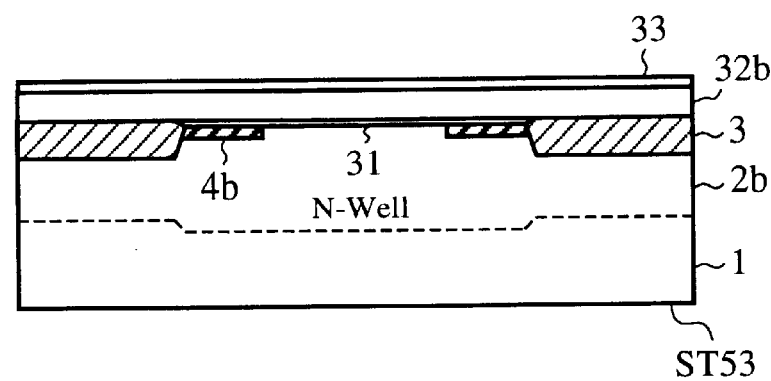
Figure 16D:
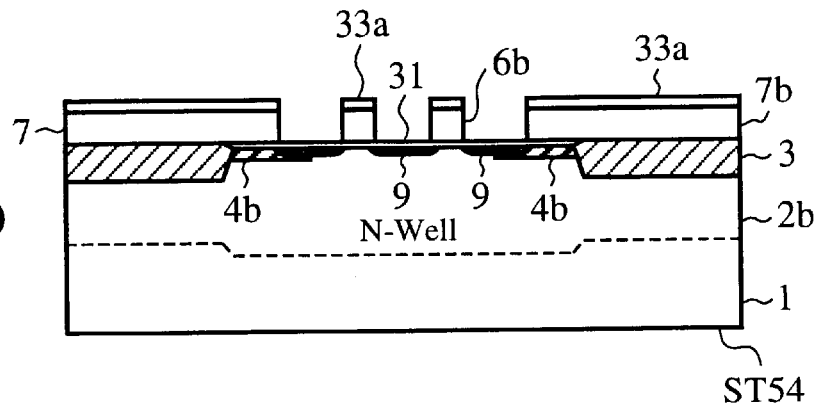
Figure 16E:
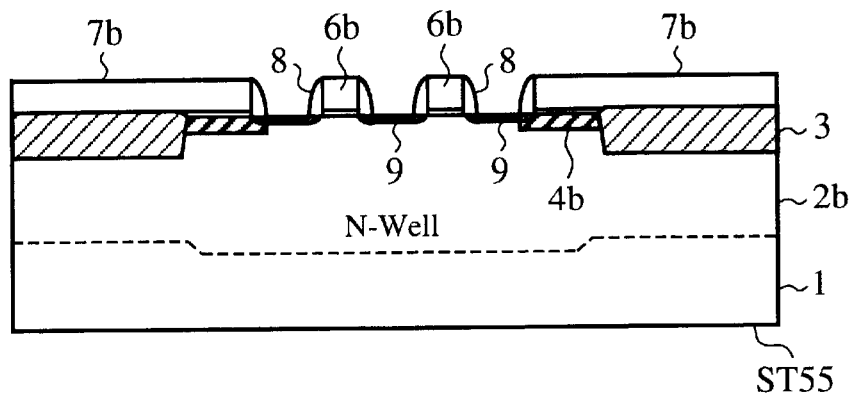
FIGS. 16E–16G are sectional process diagrams showing the method of manufacturing a semiconductor integrated circuit device in accordance with the embodiment 5 of the present invention.
Figure 16F:
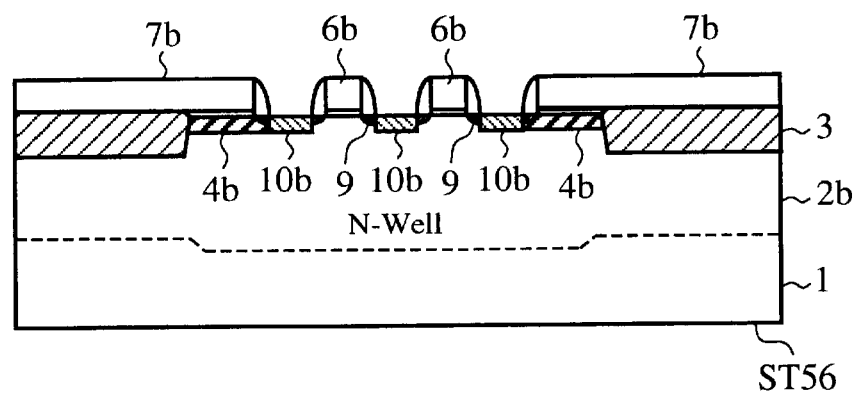

Then, at Step ST53, the gate oxide 31 is formed with a thickness of 2–8 nm on the n-type well 2b of the substrate 1; a p-doped polysilicon 32b is formed about 10 nm thick on top; further a CVD oxide 33 is formed and stacked thereon with a thickness of 10–15 nm (FIG. 16C). On top of this, at Step ST54, a desired resist pattern is formed and an etching process is then carried out through the pattern, thus forming a gate electrode 6b and a cell plate electrode 7b of a memory cell transistor (FIG. 16D).

Figure 16G:
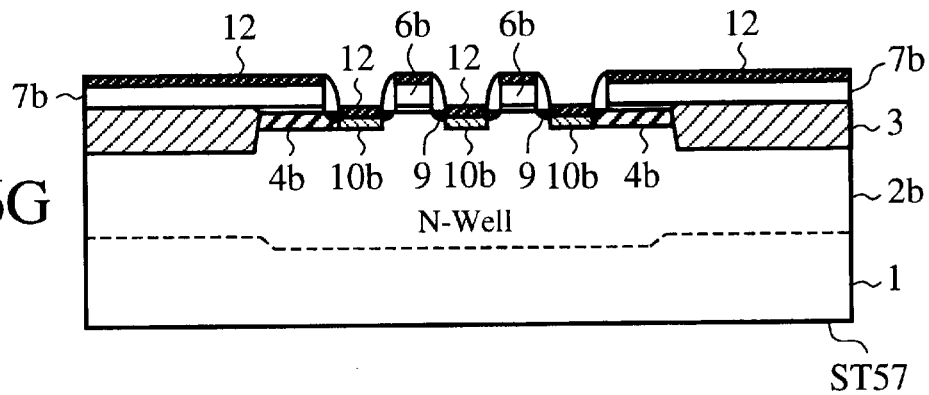
Figure 17:
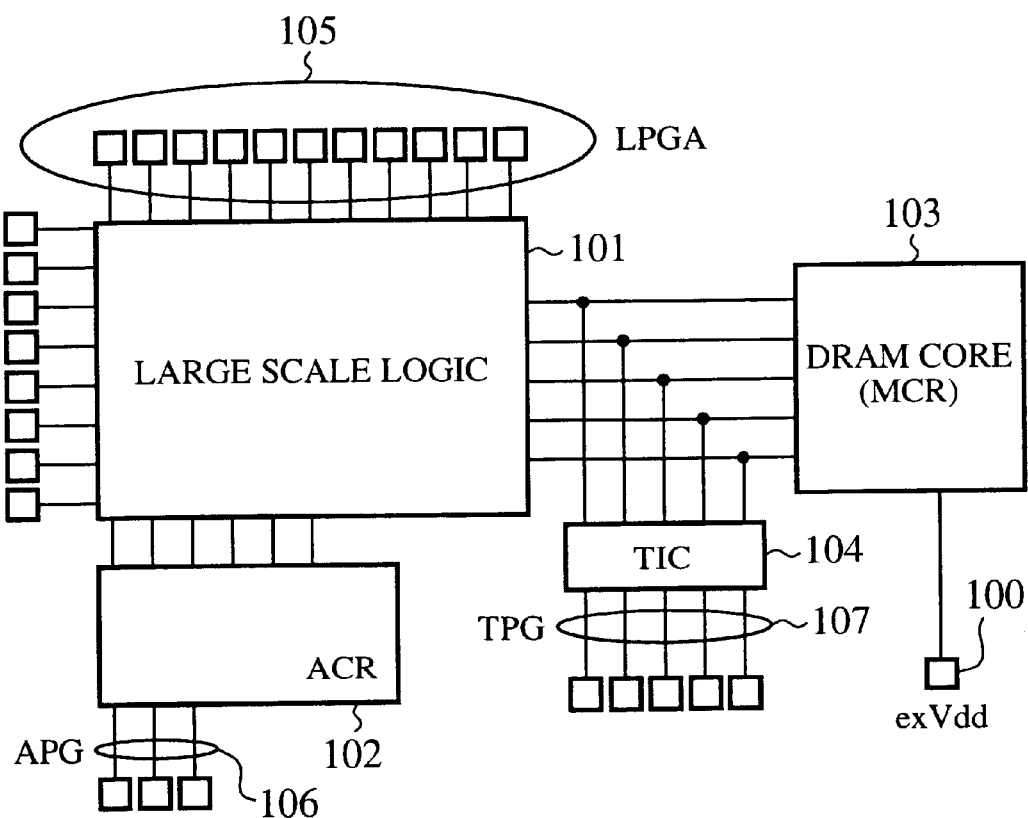
FIG. 17 is a schematic block diagram illustrating a configuration example of a conventional DRAM mixing system LSI.
Figure 18:
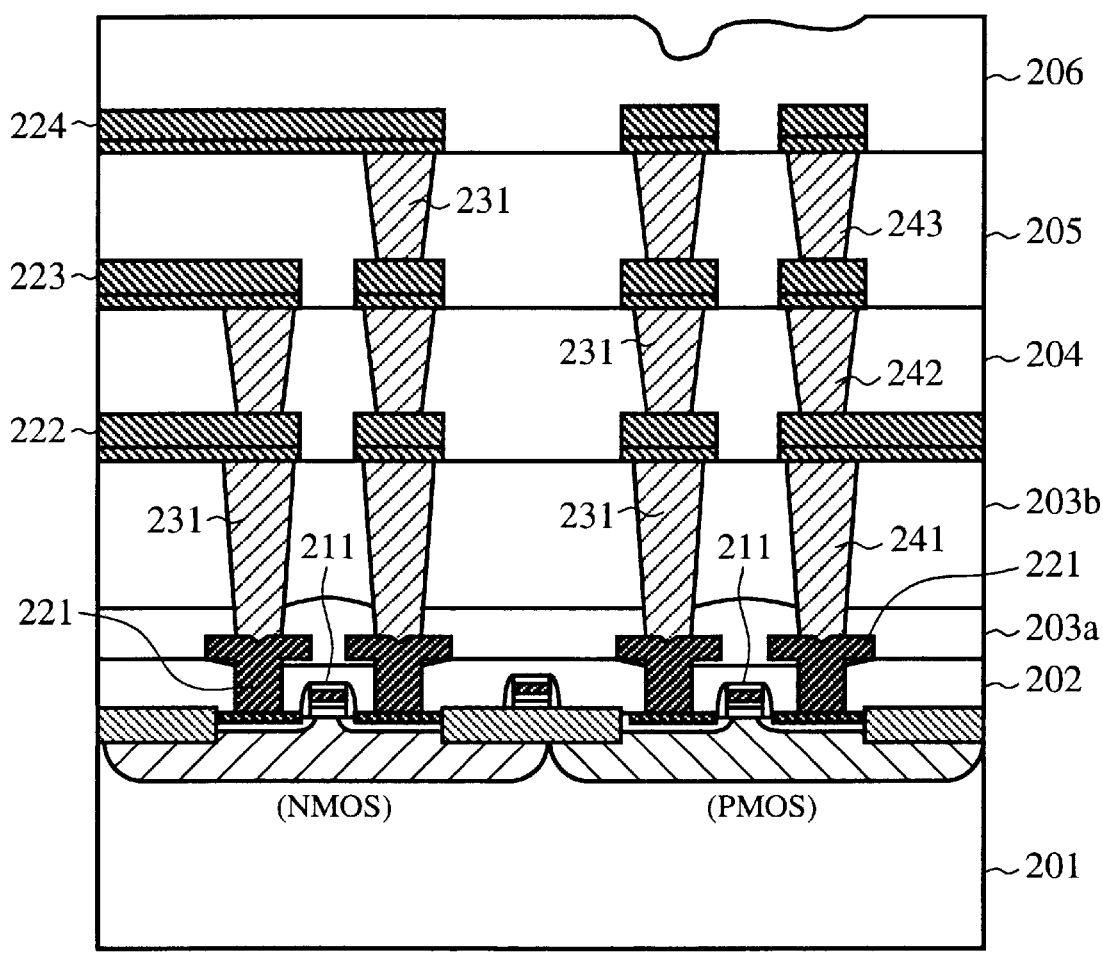
FIG. 18 is a sectional schematic illustration of a large scale logic in a conventional DRAM-logic mixing process
Figure 19:
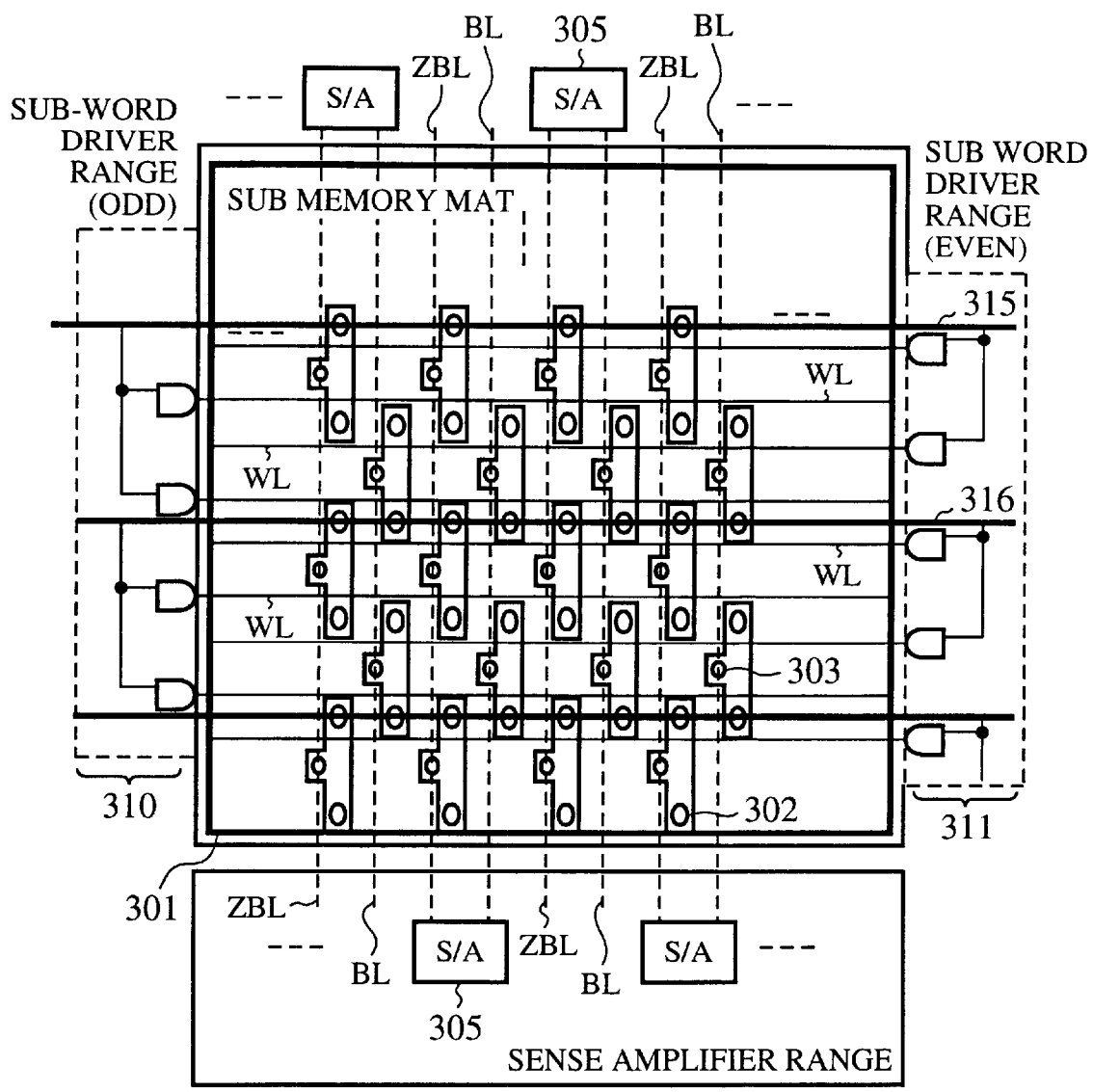
FIG. 19 is a schematic circuit diagram of a memory cell array section in a conventional DRAM core.

Subsequently, at Step ST55, a gate oxide 10 nm thick is formed with a deposition process, and sidewalls 8 are formed by anisotropic dry etching (FIG. 16E); at Step ST56, the p+ impurity region 10b is created by an ion implant (FIG. 16F); on top of this, at Step ST57, the metal silicide is formed on the n-type well 2b on the substrate 1 and on the gate electrode 6b and cell plate electrode 7b for the planar capacitor (FIG. 16G).

However, since subsequent steps conforms to ST8 to ST10 in FIG. 3 in accordance with the embodiment 1, these explanation will be omitted.

By way of the aforementioned process flow, a desired semiconductor integrated circuit device in accordance with the embodiment 5 will be obtained.

As described above, according to the embodiment 5, the DRAM memory cell having the planar-type capacitor may be created through the CMOS logic process with ease.

In addition, since the layout of the memory cell may be arranged in the closest packed cell configuration as well as the embodiment 1, the cell size can be made smaller. Further, when the aspect ratio as compared to the conventional DRAM memory cell is enlarged greatly, the size of the memory cell smaller sufficiently than that of SRAMs may be achieved.

Further, as in the embodiment 3, the thickness of the capacitor dielectric 31a is formed thinner than that of the gate oxide 31, thereby increasing the capacitor capacitance and making smaller the cell size.

What is claimed is:

1. A semiconductor integrated circuit device comprising:

a field placement creating a field pattern in an array form by closest packing on a first conductance-type semiconductor substrate, said field pattern including a plurality of memory cells which define an active area and a device isolation region of a field effect transistor, and which are arranged in a predetermined pitch in the longitudinal and transverse directions, respectively, each memory cell having a pattern of a certain length-to-width size;

a cell plate placement providing a capacitor structure between a second conductance-type diffusion region formed by an impurity implant to said active area and a cell plate electrode formed so as to cover part of said active area with a predetermined cell plate pattern through a capacitor dielectric, said cell plate pattern extending in said transverse direction with a certain length size; and a word line placement in which a word line pattern is arranged in the transverse direction of a vacant zone of said active area in which said cell plate electrode is not formed and serves as a gate electrode of said field effect transistor on said active area, said word line pattern being formed through a gate oxide at a predetermined interval, wherein the layout of a cell array of said memory cells is provided by a closest packing cell configuration.

2. The semiconductor integrated circuit device according to claim 1, wherein the pitch of the memory cell in the transverse direction is loosened and at least two bit lines are arranged for each pitch of the memory cell in the longitudinal direction.

3. The semiconductor integrated circuit device according to claim 1, wherein the thickness of the capacitor dielectric is the same as that of the gate oxide.

4. The semiconductor integrated circuit device according to claim 1, wherein the capacitor dielectric is made thinner than the gate oxide.

5. The semiconductor integrated circuit device according to claim 1, wherein another first conductance-type diffusion having a highly doped diffusion region is provided under said diffusion region.

6. The semiconductor integrated circuit device according to claim 1, wherein the capacitor structure has a trench structure.

7. The semiconductor integrated circuit device according to claim 1, wherein the first conductance-type is p-type and the second conductance-type is n-type, or the first conductance-type is n-type and the second conductance-type is p-type.

* * * * *